(12) United States Patent
Yamanishi et al.

(10) Patent No.: US 11,424,192 B2
(45) Date of Patent: Aug. 23, 2022

(54) COMPONENT-EMBEDDED SUBSTRATE

(71) Applicant: SHINKO ELECTRIC INDUSTRIES CO., LTD., Nagano (JP)

(72) Inventors: Norio Yamanishi, Nagano (JP); Takeshi Meguro, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/165,040

(22) Filed: Feb. 2, 2021

(65) Prior Publication Data
US 2021/0242134 A1 Aug. 5, 2021

(30) Foreign Application Priority Data

Feb. 5, 2020 (JP) .............................. JP2020-018317

(51) Int. Cl.
| | |
|---|---|
| *H01L 23/538* | (2006.01) |
| *H01L 23/31* | (2006.01) |
| *H01L 23/053* | (2006.01) |
| *H01L 25/16* | (2006.01) |

(52) U.S. Cl.
CPC ........ *H01L 23/5389* (2013.01); *H01L 23/053* (2013.01); *H01L 23/3128* (2013.01); *H01L 23/5383* (2013.01); *H01L 23/5384* (2013.01); *H01L 23/5385* (2013.01); *H01L 25/162* (2013.01)

(58) Field of Classification Search
CPC .............. H01L 23/5389; H01L 23/053; H01L 23/3128; H01L 23/5383; H01L 23/5384; H01L 23/5385; H01L 25/162
See application file for complete search history.

(56) References Cited

U.S. PATENT DOCUMENTS

| | | | |
|---|---|---|---|
| 7,687,899 B1 | 3/2010 | Berry | |
| 2013/0200528 A1* | 8/2013 | Lin | ................... H01L 23/3157 |
| | | | 257/774 |
| 2014/0054773 A1 | 2/2014 | Kurashima et al. | |
| 2017/0271233 A1* | 9/2017 | Imai | .................... H01L 23/4334 |
| 2019/0229078 A1* | 7/2019 | Kim | ........................ H01L 24/19 |
| 2019/0280374 A1* | 9/2019 | Kim | ................... H01L 21/4853 |
| 2020/0350254 A1* | 11/2020 | Huang | .................... H01L 21/52 |

FOREIGN PATENT DOCUMENTS

JP 2014-045051 3/2014

* cited by examiner

*Primary Examiner* — Fernando L Toledo
*Assistant Examiner* — Neil R Prasad
(74) *Attorney, Agent, or Firm* — Rankin, Hill & Clark LLP

(57) ABSTRACT

A component-embedded substrate includes a first wiring substrate, an electronic component provided on the first wiring substrate, an intermediate wiring substrate provided around the electronic component on the first wiring substrate and connected to the first wiring substrate via a first connection member, a second wiring substrate provided above the first wiring substrate, the electronic component and the intermediate wiring substrate, and connected to the intermediate wiring substrate via a second connection member, and an encapsulating resin filled between the first wiring substrate and the second wiring substrate and covering the electronic component and the intermediate wiring substrate. Side surfaces of the intermediate wiring substrate are entirely covered by the encapsulating resin.

16 Claims, 34 Drawing Sheets

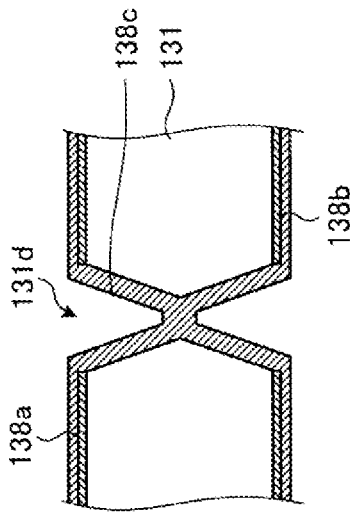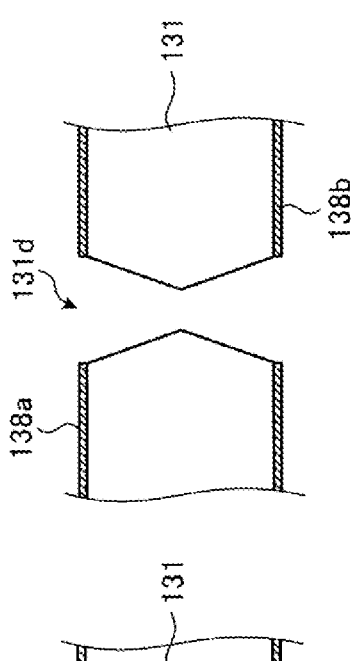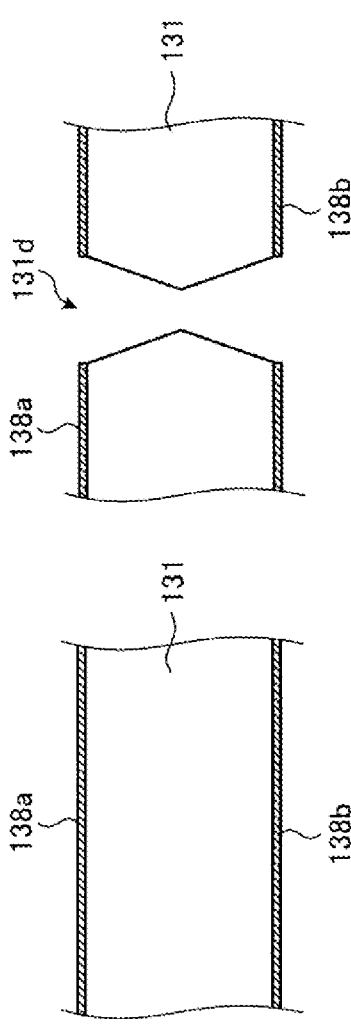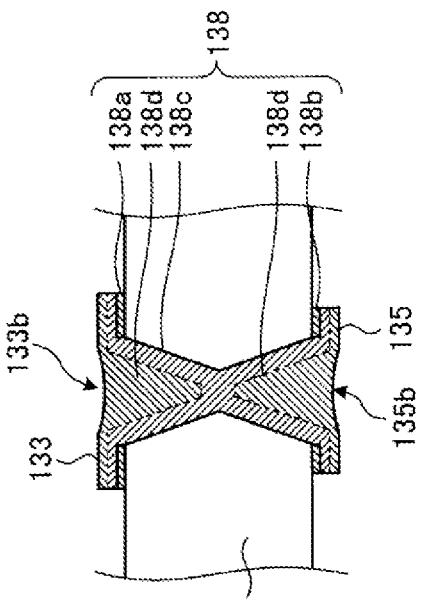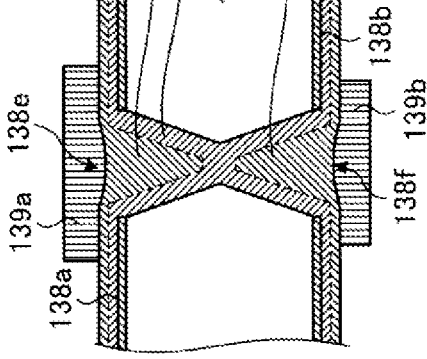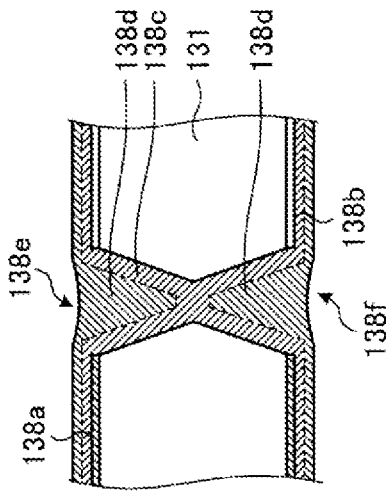

COMPONENT-EMBEDDED SUBSTRATE

CROSS-REFERENCE TO RELATED APPLICATIONS

This application is based upon and claims the benefit of priority from prior Japanese patent application No. 2020-018317, filed on Feb. 5, 2020, the entire contents of which are incorporated herein by reference.

TECHNICAL FIELD

The present invention relates to a component-embedded substrate.

BACKGROUND ART

Recently, in order to implement high-density component mounting, for example, a component-embedded substrate where electronic components such as an IC (Integrated Circuit) chip are embedded in a substrate is attracting attention. The component-embedded substrate has, for example, two wiring substrates, the electronic component such as IC chip are mounted on one wiring substrate, and the electronic components are sandwiched between one wiring substrate and the other wiring substrate. A space between the two wiring substrates is filled with an encapsulating resin for covering the electronic components, for example.

In the component-embedded substrate, an intermediate wiring substrate may be interposed between the two wiring substrates. That is, the intermediate wiring substrate is arranged around the electronic components on one wiring substrate, and the intermediate wiring substrate and one wiring substrate are connected to each other by connection members such as solder balls, for example. The other wiring substrate is arranged above the intermediate wiring substrate so as to sandwich the electronic components between the other wiring substrate and one wiring substrate, and the other wiring substrate and the intermediate wiring substrate are connected to each other by connection members such as solder balls, for example. The encapsulating resin filled in the space between the two wiring substrates is also filled in a space between the intermediate wiring substrate and each of the wiring substrates.

In this way, the intermediate wiring substrate is interposed between the two wiring substrates, so that it is possible to adjust an interval between the two wiring substrates according to heights of the electronic components to be embedded, thereby improving a degree of freedom of component mounting.

CITATION LIST

Patent Literature

[PTL 1] JP-A-2014-45051
[PTL 2] U.S. Pat. No. 7,687,899

In the component-embedded substrate where the intermediate wiring substrate is interposed between the two wiring substrates, a side surface of the intermediate wiring substrate on an opposite side to the electronic components is generally exposed from the encapsulating resin on a side surface of the component-embedded substrate. On the side surface of the intermediate wiring substrate exposed from the encapsulating resin, an interface between the intermediate wiring substrate and the encapsulating resin is in contact with an external environment of the component-embedded substrate. Therefore, moisture is likely to be introduced into the component-embedded substrate from the interface between the intermediate wiring substrate and the encapsulating resin. The introduction of the moisture into the component-embedded substrate is not preferable because expansion of the water vapor causes cracks in the encapsulating resin (a so-called popcorn phenomenon) and metal ions elute from an electrode and a wiring (a so-called migration phenomenon).

SUMMARY OF INVENTION

Aspect of non-limiting embodiments of the present disclosure is to provide a component-embedded substrate capable of suppressing moisture from being introduced into the component-embedded substrate.

A component-embedded substrate according to non-limiting embodiment of the present disclosure comprises:
a first wiring substrate;
an electronic component provided on the first wiring substrate;
an intermediate wiring substrate provided around the electronic component on the first wiring substrate and connected to the first wiring substrate via a first connection member;
a second wiring substrate provided above the first wiring substrate, the electronic component and the intermediate wiring substrate, and connected to the intermediate wiring substrate via a second connection member; and
an encapsulating resin filled between the first wiring substrate and the second wiring substrate and covering the electronic component and the intermediate wiring substrate, wherein side surfaces of the intermediate wiring substrate are entirely covered by the encapsulating resin.

According to one aspect of the component-embedded substrate of the present disclosure, it is possible to suppress moisture from being introduced into the component-embedded substrate.

BRIEF DESCRIPTION OF DRAWINGS

FIGS. 37A to 37F illustrate another example of the wiring layer forming process.

DESCRIPTION OF EMBODIMENTS

Hereinbelow, embodiments of a component-embedded substrate and a manufacturing method of a component-embedded substrate of the present disclosure will be described in detail with reference to the drawings. Note that, the disclosed technology is not limited by the embodiments.

Embodiments

[Configuration of Component-Embedded Substrate]

Figure 1:
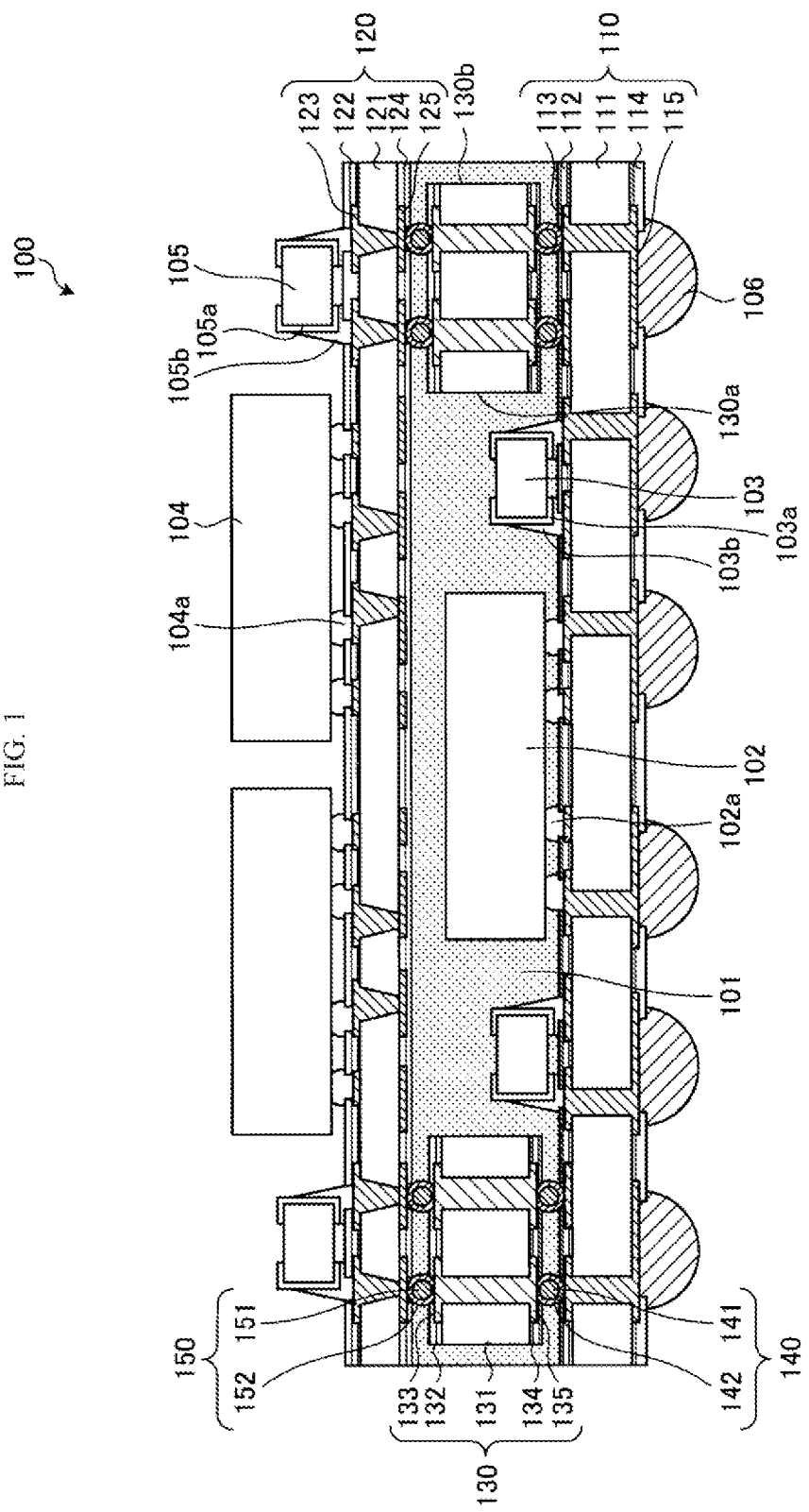
FIG. 1 depicts a configuration of a component-embedded substrate according to an embodiment.

FIG. 1 depicts a configuration of a component-embedded substrate 100 according to an embodiment. FIG. 1 pictorially depicts a section of the component-embedded substrate 100. In descriptions below, a surface of the component-embedded substrate 100, which is positioned on an external component or device-side when connecting the component-embedded substrate 100 to the external component or device is referred to as "lower surface", a surface positioned on an opposite side to the external component or device is referred to as "upper surface", and a vertical direction is defined based on the lower and upper surfaces. However, the component-embedded substrate 100 may also be manufactured and used with being upside down, for example, and may also be manufactured and used in any posture.

The component-embedded substrate 100 shown in FIG. 1 includes a lower wiring substrate 110, an upper wiring substrate 120, and an encapsulating resin 101 for covering electronic components sandwiched and arranged between the lower wiring substrate 110 and the upper wiring substrate 120. Specifically, an IC chip 102 and electronic components 103 are mounted on an upper surface of the lower wiring substrate 110, are sandwiched by the lower wiring substrate 110 and the upper wiring substrate 120 and are covered by the encapsulating resin 101. The encapsulating resin 101 is an insulating resin such as a thermosetting epoxy-based resin containing inorganic fillers such as alumina, silica, aluminum nitride, silicon carbide and the like, for example. A side surface of the encapsulating resin 101, a side surface of the lower wiring substrate 110 and a side surface of the upper wiring substrate 120 are formed on the same plane, thereby forming a side surface of the component-embedded substrate 100. IC chips 104 and electronic components 105 are mounted on an upper surface of the upper wiring substrate 120. Also, a lower surface of the lower wiring substrate 110 is a surface that is connected to an external component, a device and the like, and the lower surface is formed with external connection terminals such as solder balls 106, for example. Herein, the IC chips 102 and 104 and the electronic components 103 and 105 are distinguished from each other but the IC chips 102 and 104 are also a kind of the electronic component.

The component-embedded substrate 100 has a configuration where intermediate wiring substrates 130 for electrically connecting the lower wiring substrate 110 and the upper wiring substrate 120 are interposed between the lower wiring substrate 110 and the upper wiring substrate 120. That is, the intermediate wiring substrates 130 are arranged around the IC chip 102 and the electronic components 103 on the lower wiring substrate 110, and the intermediate wiring substrates 130 and the lower wiring substrate 110 are connected to each other by connection members 140. Also, the upper wiring substrate 120 is arranged above the intermediate wiring substrates 130 so as to sandwich the IC chip 102 and the electronic components 103 between the upper wiring substrate 120 and the lower wiring substrate 110, and the upper wiring substrate 120 and the intermediate wiring substrates 130 are connected to each other by connection members 150.

The intermediate wiring substrates 130 are entirely covered by the encapsulating resin 101 together with the IC chip 102 and the electronic components 103 on the lower wiring substrate 110. For this reason, on the side surface of the component-embedded substrate 100, interfaces between the intermediate wiring substrates 130 and the encapsulating resin 101 are isolated from an external environment of the component-embedded substrate 100 by the encapsulating resin 101, so that moisture is suppressed from being introduced into the component-embedded substrate 100 from the interfaces.

The lower wiring substrate 110 is quadrangular, as seen from above, and includes a substrate 111, a solder resist layer 112, upper surface pads 113, a solder resist layer 114 and lower surface pads 115. The upper surface pads 113 and the lower surface pads 115 are connected by via wirings, as required. In this specification, the term "quadrangular" means a quadrangular in which all four angles are 90 degrees respectively, such as a square or rectangular.

The substrate 111 is an insulating plate-shaped member, and is a base material of the lower wiring substrate 110. As a material of the substrate 111, for example, a glass epoxy resin where a thermosetting insulating resin having an epoxy resin as a main component is impregnated and cured in a glass cloth (glass woven fabric) that is a reinforcing material can be used. The reinforcing material is not limited to the glass cloth, and for example, a glass non-woven fabric, an aramid woven fabric, an aramid non-woven fabric, a liquid crystal polymer (LCP) woven fabric, an LCP non-woven fabric and the like can be used. Also, as the thermosetting insulating resin, a polyimide resin, a cyanate resin and the like can be used, in addition to the epoxy resin. Both surfaces of the substrate 111 are formed thereon with wiring layers including the upper surface pads 113 and the lower surface pads 115. As a material of the wiring layer, for example, copper (Cu) or copper alloy can be used.

The solder resist layer 112 is an insulation layer for covering an upper surface of the substrate 111 and a wiring layer of the upper surface of the substrate 111. The solder resist layer 112 is partially formed with opening portions, and the upper surface pads 113 are exposed from the opening portions. As a material of the solder resist layer 112, for example, an insulating resin such as an epoxy-based resin, an acryl-based resin and the like can be used.

The upper surface pads 113 are formed on the wiring layer of the upper surface of the substrate 111, and are exposed from the opening portions of the solder resist layer 112 for connection with the connection members 140 and mounting of the IC chip 102 and the electronic components 103. That is, some of the upper surface pads 113 are bonded to the connection members 140. Also, some of the upper surface pads 113 are connected to the IC chip 102. Specifically, for example, terminals of the IC chip 102 are flip chip-connected to the upper surface pads 113 by solder balls 102*a*. An underfill material may also be filled between the lower wiring substrate 110 and the IC chip 102, as required. Also, some of the upper surface pads 113 are connected to terminals 103*a* of the electronic components 103 by solders 103*b*. As a material of the upper surface pad 113, for example, copper or copper alloy can be used, similarly to the wiring layer.

The solder resist layer 114 is an insulation layer for covering a lower surface of the substrate 111 and a wiring layer of the lower surface of the substrate 111. The solder resist layer 114 is partially formed with opening portions, and the lower surface pads 115 are exposed from the opening portions. As a material of the solder resist layer 114, for example, an insulating resin such as an epoxy-based resin, an acryl-based resin and the like can be used.

The lower surface pads 115 are formed on the wiring layer of the lower surface of the substrate 111, and are exposed from the opening portions of the solder resist layer 114 for formation of external connection terminals. That is, the lower surface pad 115 is formed with an external connection terminal such as a solder ball 106, for example. As a material of the lower surface pad 115, for example, copper or copper alloy can be used, similarly to the wiring layer.

The upper wiring substrate 120 is quadrangular, as seen from above, and includes a substrate 121, a solder resist layer 122, upper surface pads 123, a solder resist layer 124 and lower surface pads 125. The upper surface pads 123 and the lower surface pads 125 are connected to each other by via wirings, as required.

The substrate 121 is an insulating plate-shaped member, and is a base material of the upper wiring substrate 120. As a material of the substrate 121, for example, a glass epoxy resin where a thermosetting insulating resin having an epoxy resin as a main component is impregnated and cured in a glass cloth (glass woven fabric) that is a reinforcing material can be used. The reinforcing material is not limited to the glass cloth, and for example, a glass non-woven fabric, an aramid woven fabric, an aramid non-woven fabric, an LCP woven fabric, an LCP non-woven fabric and the like can be used. Also, as the thermosetting insulating resin, a polyimide resin, a cyanate resin and the like can be used, in addition to the epoxy resin. Both surfaces of the substrate 121 are formed thereon with wiring layers including the upper surface pads 123 and the lower surface pads 125. As a material of the wiring layer, for example, copper or copper alloy can be used.

The solder resist layer 122 is an insulation layer for covering an upper surface of the substrate 121 and a wiring layer of the upper surface of the substrate 121. The solder resist layer 122 is partially formed with opening portions, and the upper surface pads 123 are exposed from the opening portions. As a material of the solder resist layer 122, for example, an insulating resin such as an epoxy-based resin, an acryl-based resin and the like can be used.

The upper surface pads 123 are formed on the wiring layer of the upper surface of the substrate 121, and are exposed from the opening portions of the solder resist layer 122 for mounting of the IC chips 104 and the electronic components 105. That is, some of the upper surface pads 123 are connected to the IC chips 104. Specifically, for example, terminals of the IC chips 104 are flip chip-connected to the upper surface pads 123 by solder balls 104*a*. An underfill material may also be filled between the upper wiring substrate 120 and the IC chips 104, as required. Also, some of the upper surface pads 123 are connected to terminals 105*a* of the electronic components 105 by solders 105*b*. As a material of the upper surface pad 123, for example, copper or copper alloy can be used, similarly to the wiring layer.

The solder resist layer 124 is an insulation layer for covering a lower surface of the substrate 121 and a wiring layer of the lower surface of the substrate 121. The solder resist layer 124 is partially formed with opening portions, and the lower surface pads 125 are exposed from the opening portions. As a material of the solder resist layer 124, for example, an insulating resin such as an epoxy-based resin, an acryl-based resin and the like can be used.

The lower surface pads 125 are formed on the wiring layer of the lower surface of the substrate 121, and are exposed from the opening portions of the solder resist layer 124 for connection with the connection members 150. That is, the lower surface pads 125 are bonded to the connection members 150. As a material of the lower surface pad 125, for example, copper or copper alloy can be used, similarly to the wiring layer.

The intermediate wiring substrate 130 is quadrangular (for example, rectangular), as seen from above, and includes a substrate 131, a solder resist layer 132, upper surface pads 133, a solder resist layer 134 and lower surface pads 135. The upper surface pads 133 and the lower surface pads 135 are connected to each other by through-wirings such as through-hole wirings, as required.

The substrate 131 is an insulating plate-shaped member, and is a base material of the intermediate wiring substrate 130. As a material of the substrate 131, for example, a glass epoxy resin where a thermosetting insulating resin having an epoxy resin as a main component is impregnated and cured in a glass cloth (glass woven fabric) that is a reinforcing material can be used. The reinforcing material is not limited to the glass cloth, and for example, a glass non-woven fabric, an aramid woven fabric, an aramid non-woven fabric, an LCP woven fabric, an LCP non-woven fabric and the like can be used. Also, as the thermosetting insulating resin, a polyimide resin, a cyanate resin and the like can be used, in addition to the epoxy resin. Both surfaces of the substrate 131 are formed thereon with wiring layers including the upper surface pads 133 and the lower surface pads 135. As a material of the wiring layer, for example, copper or copper alloy can be used.

The solder resist layer 132 is an insulation layer for covering an upper surface of the substrate 131 and a wiring layer of the upper surface of the substrate 131. The solder resist layer 132 is partially formed with opening portions, and the upper surface pads 133 are exposed from the opening portions. As a material of the solder resist layer 132, for example, an insulating resin such as an epoxy-based resin, an acryl-based resin and the like can be used.

The upper surface pads 133 are formed on the wiring layer of the upper surface of the substrate 131, and are exposed from the opening portions of the solder resist layer 132 for connection with the connection members 150. That is, the upper surface pads 133 are bonded to the connection members 150. As a material of the upper surface pad 133, for example, copper or copper alloy can be used, similarly to the wiring layer.

The solder resist layer 134 is an insulation layer for covering a lower surface of the substrate 131 and a wiring layer of the lower surface of the substrate 131. The solder resist layer 134 is partially formed with opening portions, and the lower surface pads 135 are exposed from the opening portions. As a material of the solder resist layer 134, for example, an insulating resin such as an epoxy-based resin, an acryl-based resin and the like can be used.

The lower surface pads 135 are formed on the wiring layer of the lower surface of the substrate 131, and are exposed from the opening portions of the solder resist layer 134 for connection with the connection members 140. That is, the lower surface pads 135 are bonded to the connection members 140. As a material of the lower surface pad 135, for example, copper or copper alloy can be used, similarly to the wiring layer.

Side surfaces of the substrate 131, the solder resist layer 132 and the solder resist layer 134 are entirely covered by the encapsulating resin 101. That is, the side surfaces of the substrate 131, the solder resist layer 132 and the solder resist layer 134 are in contact with the encapsulating resin 101 as a whole. Thereby, not only a side surface 130a of the intermediate wiring substrate 130 positioned around the IC chip 102 and the electronic components 103 but also a side surface 130b on an opposite side to the IC chip 102 and the electronic components 103 is covered by the encapsulating resin 101. Also, a side surface between the side surface 130a and the side surface 130b is covered by the encapsulating resin 101. In other words, an outer peripheral surface connecting an upper surface and a lower surface of the intermediate wiring substrate 130 is entirely covered by the encapsulating resin 101. Since the side surface 130b of the intermediate wiring substrate 130 is covered by the encapsulating resin 101, the interface between the intermediate wiring substrate 130 and the encapsulating resin 101 on the side surface of the component-embedded substrate 100 is not exposed to an external environment, so that moisture can be suppressed from being introduced into the component-embedded substrate 100.

The side surface 130b of the intermediate wiring substrate 130 faces toward an outer peripheral edge-side of the lower wiring substrate 110 and the upper wiring substrate 120. The side surface between the side surface 130a and the side surface 130b also faces toward the outer peripheral edge-side of the lower wiring substrate 110 and the upper wiring substrate 120. Also, a predetermined interval is provided between the side surface 130b and the outer peripheral edges of the lower wiring substrate 110 and the upper wiring substrate 120. Also, a predetermined interval is provided between the side surface between the side surface 130a and the side surface 130b and the outer peripheral edges of the lower wiring substrate 110 and the upper wiring substrate 120.

The intermediate wiring substrate 130 is arranged as follows, as seen from above. That is, the intermediate wiring substrate 130 is arranged between the lower wiring substrate 110 and the upper wiring substrate 120 so that one side (a side on the side surface 130b-side) of the quadrangular intermediate wiring substrate 130 is spaced apart from one side of the quadrangular lower wiring substrate 110 and one side of the quadrangular upper wiring substrate 120 by a predetermined interval. Also, the intermediate wiring substrate 130 is arranged between the lower wiring substrate 110 and the upper wiring substrate 120 so that one side (a side on the side surface 130b-side) of the quadrangular intermediate wiring substrate 130 is parallel to one side of the quadrangular lower wiring substrate 110 and one side of the quadrangular upper wiring substrate 120.

In a case where the lower wiring substrate 110 and the upper wiring substrate 120 are quadrangular, as seen from above, and the intermediate wiring substrate 130 is rectangular, as seen from above, the intermediate wiring substrate 130 is also arranged as follows, as seen from above. That is, the two intermediate wiring substrates 130 are arranged between the lower wiring substrate 110 and the upper wiring substrate 120 so that long sides (long sides on the side surface 130b-side) of the rectangular intermediate wiring substrates 130 are along two facing sides of the lower wiring substrate 110 and the upper wiring substrate 120.

The connection member 140 is formed by a solder ball having a copper core, for example, and connects the lower wiring substrate 110 and the intermediate wiring substrate 130 each other. Specifically, the connection member 140 has a substantially spherical core 141 and a solder 142 for covering an outer peripheral surface of the core 141. For the core 141, for example, a metal core composed of metal such as copper, gold (Au), nickel (Ni) or the like, a resin core composed of a resin, and the like can be used. For the solder 142, for example, an alloy including lead (Pb), an alloy of tin (Sn) and copper, an alloy of tin (Sn) and antimony (Sb), an alloy of tin (Sn) and silver (Ag), an alloy of tin (Sn), silver (Ag) and copper, and the like can be used.

The connection member 150 is formed by a solder ball having a copper core, for example, and connects the intermediate wiring substrate 130 and the upper wiring substrate 120 each other. Specifically, the connection member 150 has a substantially spherical core 151 and a solder 152 for covering an outer peripheral surface of the core 151. For the core 151, for example, a metal core composed of metal such as copper, gold, nickel or the like, a resin core composed of a resin, and the like can be used. For the solder 152, for example, an alloy including lead, an alloy of tin and copper, an alloy of tin and antimony, an alloy of tin and silver, an alloy of tin, silver and copper, and the like can be used. A diameter of the connection member 150 can be determined, taking into account of a thickness of the intermediate wiring substrate 130, a diameter of the connection member 140, and heights of the IC chip 102 and the electronic components 103 from the upper surface of the lower wiring substrate 110. For example, the diameter of the connection member 150 can be determined so that a total of a thickness of the intermediate wiring substrate 130, a diameter of the connection member 140, and a diameter of the connection member 150 is greater than heights of the IC chip 102 and the electronic components 103 from the upper surface of the lower wiring substrate 110. Also, the diameter of the connection member 150 may be the same as or different from the diameter of the connection member 140.

Figure 2:
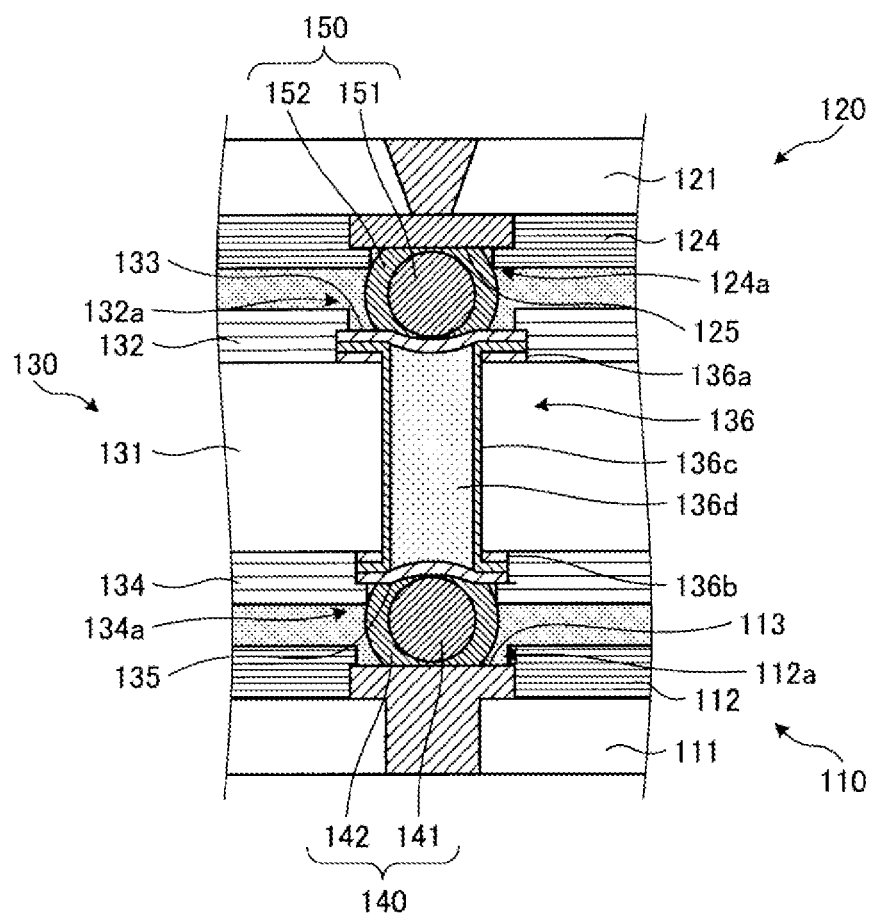
FIG. 2 is an enlarged sectional view of connection parts of a lower wiring substrate, an upper wiring substrate and an intermediate wiring substrate.

Here, connection parts of the lower wiring substrate 110, the upper wiring substrate 120 and the intermediate wiring substrate 130 are described in more detail with reference to FIG. 2. FIG. 2 is an enlarged sectional view of connection parts of the lower wiring substrate 110, the upper wiring substrate 120 and the intermediate wiring substrate 130. As shown in FIG. 2, the wiring layer of the upper surface of the substrate 111 of the lower wiring substrate 110 is formed with the upper surface pad 113 for connecting the connection member 140. The upper surface of the substrate 111 is covered by the solder resist layer 112 having an opening portion 112a formed in a position of the upper surface pad 113. The upper surface pad 113 is exposed from the opening portion 112a of the solder resist layer 112.

In the intermediate wiring substrate 130, the wiring layer of the upper surface of the substrate 131 is formed with the upper surface pad 133 for connecting the connection member 150, and the wiring layer of the lower surface of the substrate 131 is formed with the lower surface pad 135 for connecting the connection member 140. The upper surface of the substrate 131 is covered by the solder resist layer 132 having an opening portion 132a formed in the position of the upper surface pad 133, and the lower surface of the substrate 131 is covered by the solder resist layer 134 having an opening portion 134a formed in the position of the lower surface pad 135. The upper surface pad 133 is exposed from the opening portion 132a of the solder resist layer 132, and the lower surface pad 135 is exposed from the opening portion 134a of the solder resist layer 134. A diameter of the opening portion 134a of the solder resist layer 134 is smaller than a diameter of the opening portion 112a of the solder resist layer 112. Since the diameter of the opening portion 134a is smaller than the diameter of the opening portion 112a, when the connection member 140 is bonded to the lower surface pad 135 exposed from the opening portion 134a, movement of the connection member 140 relative to the lower surface pad 135 is restricted by a peripheral edge of the opening portion 112a. For this reason, positional misalignment of the connection member 140 with respect to the lower surface pad 135 can be suppressed, and bad connection between the lower wiring substrate 110 and the intermediate wiring substrate 130 that are connected by the connection member 140 can be prevented.

In the upper wiring substrate 120, the wiring layer of the lower surface of the substrate 121 is formed with the lower surface pad 125 for connecting the connection member 150. The lower surface of the substrate 121 is covered by the solder resist layer 124 having an opening portion 124a formed in the position of the lower surface pad 125. The lower surface pad 125 is exposed from the opening portion 124a of the solder resist layer 124. A diameter of the opening portion 124a of the solder resist layer 124 is smaller than a diameter of the opening portion 132a of the solder resist layer 132. Since the diameter of the opening portion 124a is smaller than the diameter of the opening portion 132a, when the connection member 150 is bonded to the lower surface pad 125 exposed from the opening portion 124a, movement of the connection member 150 relative to the lower surface pad 125 is restricted by a peripheral edge of the opening portion 124a. For this reason, positional misalignment of the connection member 150 with respect to the lower surface pad 125 can be suppressed, and bad connection between the intermediate wiring substrate 130 and the upper wiring substrate 120 that are connected by the connection member 150 can be prevented.

The substrate 131 of the intermediate wiring substrate 130 is provided with through-hole wirings 136 penetrating the substrate 131, and the upper surface pads 133 and the lower surface pads 135 are connected to each other by the through-hole wirings 136. The through-hole wiring 136 has metal layers 136a and 136b formed on both surfaces of the substrate 131, a plated layer 136c that covers surfaces of the metal layers 136a and 136b and an inner wall surface of a through-hole penetrating the substrate 131, and a filled resin 136d filled in the through-hole of the substrate 131. The metal layers 136a and 136b are, for example, copper metal layers. The plated layer 136c is formed by electroless copper plating and electrolytic copper plating, for example. As a material of the filled resin 136d, for example, an insulating resin such as an epoxy-based resin can be used. The upper surface pad 133 and the lower surface pad 135 are each formed with concave portions in positions corresponding to the through-hole wiring 136. That is, the upper surface pad 133 to which the connection member 150 is bonded and the lower surface pad 135 to which the connection member 140 is bonded are each formed with concave portions. Each concave portion of the upper surface pad 133 and the lower surface pad 135 is concave in a curved shape toward a central direction of a thickness of the substrate 131. Since the connection member 150 is accommodated in the concave portion of the upper surface pad 133, it is possible to accurately perform positional alignment of the connection member 150 with respect to the intermediate wiring substrate 130. Also, since the connection member 140 is accommodated in the concave portion of the lower surface pad 135, it is possible to accurately perform positional alignment of the connection member 140 with respect to the intermediate wiring substrate 130.

The upper surface pad 133 to which the connection member 150 is bonded and the lower surface pad 135 to which the connection member 140 is bonded are arranged in positions overlapping each other, when seeing the intermediate wiring substrate 130 in a thickness direction (i.e., a vertical direction). For this reason, the connection member 140 and the connection member 150 are arranged in positions overlapping each other, when seeing the intermediate wiring substrate 130 in the thickness direction (i.e., the vertical direction). Thereby, an electrical distance between the lower wiring substrate 110 and the upper wiring substrate 120 that are connected via the intermediate wiring substrate 130 is minimized, so that an impedance between the lower wiring substrate 110 and the upper wiring substrate 120 can be reduced.

Note that, a magnitude relation between a diameter of the upper surface pad 113 of the lower wiring substrate 110 and a diameter of the lower surface pad 135 of the intermediate wiring substrate 130 may be matched with a corresponding magnitude relation between the diameter of the opening portion 112a of the solder resist layer 112 and the diameter of the opening portion 134a of the solder resist layer 134. That is, the diameter of the lower surface pad 135 may be made smaller than the diameter of the upper surface pad 113.

Also, a magnitude relation between a diameter of the upper surface pad 133 of the intermediate wiring substrate 130 and a diameter of the lower surface pad 125 of the upper wiring substrate 120 may be matched with a corresponding magnitude relation between the diameter of the opening portion 132a of the solder resist layer 132 and the diameter of the opening portion 124a of the solder resist layer 124. That is, the diameter of the lower surface pad 125 may be made smaller than the diameter of the upper surface pad 133.

Also, in a case where the diameter of the connection member 140 and the diameter of the connection member 150 are the same, the diameter of the opening portion 134*a* of the solder resist layer 134 of the intermediate wiring substrate 130 is smaller than the diameter of the opening portion 132*a* of the solder resist layer 132 of the intermediate wiring substrate 130. In this case, the diameter of the lower surface pad 135 of the intermediate wiring substrate 130 may be made smaller than the diameter of the upper surface pad 133.

[Manufacturing Method of Component-Embedded Substrate]

Subsequently, a manufacturing method of the component-embedded substrate 100 configured as described above is described. In the below, after describing a manufacturing method of the lower wiring substrate 110, a manufacturing method of the upper wiring substrate 120 and a manufacturing method of the intermediate wiring substrate 130, a manufacturing method of the component-embedded substrate 100 including the lower wiring substrate 110, the upper wiring substrate 120 and the intermediate wiring substrate 130 is described.

Figure 3:
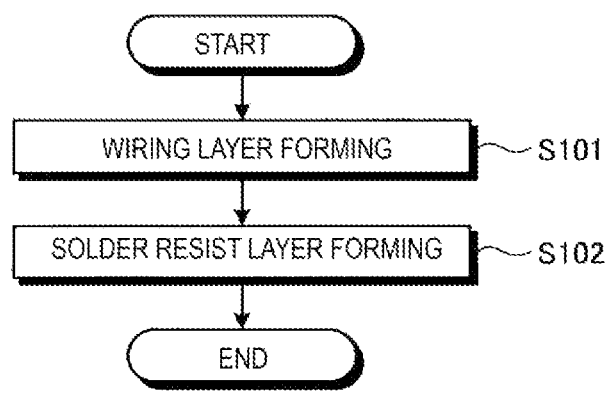
FIG. 3 is a flowchart depicting a manufacturing method of the lower wiring substrate.

FIG. 3 is a flowchart depicting a manufacturing method of the lower wiring substrate 110.

First, the upper surface and the lower surface of the substrate 111 are formed with the wiring layers (step S101). Specifically, for example, the wiring layers of the upper surface and the lower surface of the substrate 111 are sequentially formed by a semi-additive method. The wiring layer of the upper surface of the substrate 111 includes the upper surface pads 113, and the wiring layer of the lower surface of the substrate 111 includes the lower surface pads 115. The upper surface of the substrate 111 is formed with the solder resist layer 112 having opening portions in positions of the upper surface pads 113, and the lower surface of the substrate 111 is formed with the solder resist layer 114 having opening portions in positions of the lower surface pads 115 (step S102). The solder resist layers 112 and 114 are obtained by laminating photosensitive resin films or applying liquid or paste-like resins on the upper surface and the lower surface of the substrate 111, and exposing/developing the laminated or applied resins and patterning the resins into desired shapes by a photolithography method, for example.

Figure 4:
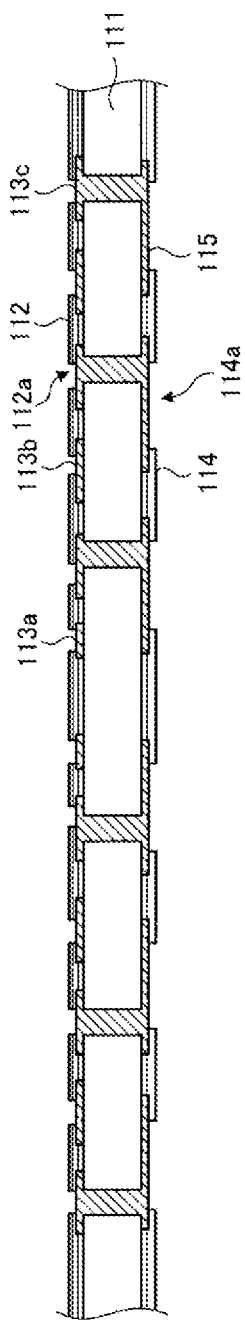
FIG. 4 is a pictorial view depicting a section of the lower wiring substrate.

By the above processes, for example, as shown in FIG. 4, in the lower surface of the substrate 111, the lower surface pads 115 are exposed from the opening portions 114*a* of the solder resist layer 114, and in the upper surface of the substrate 111, upper surface pads 113*a*, 113*b* and 113*c* are exposed from the opening portions 112*a* of the solder resist layer 112. Thereby, the lower wiring substrate 110 that forms a lower layer of the component-embedded substrate 100 is obtained. FIG. 4 is a pictorial view depicting a section of the lower wiring substrate 110. The upper surface pad 113*a* is a pad for flip chip-connecting the IC chip 102, the upper surface pad 113*b* is a pad for connecting the terminal of the electronic component 103, and the upper surface pad 113*c* is a pad that is connected to the connection member 140.

Note that, the lower wiring substrate 110 is preferably manufactured as an assembly in which a plurality of lower wiring substrates 110 is aligned, other than being manufactured as a single body. In the assembly, for example, the lower wiring substrate 110 is manufactured in each of compartments divided into a grid shape.

Figure 5:
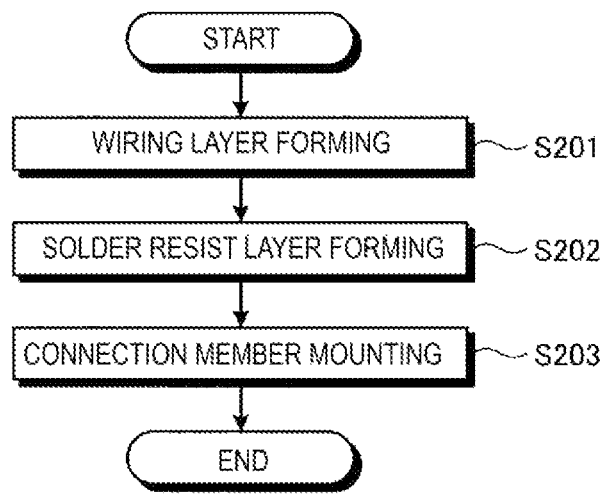
FIG. 5 is a flowchart depicting a manufacturing method of the upper wiring substrate.

FIG. 5 is a flowchart depicting a manufacturing method of the upper wiring substrate 120.

First, the upper surface and the lower surface of a substrate 121 are formed with the wiring layers (step S201). Specifically, for example, the wiring layers of the upper surface and the lower surface of the substrate 121 are sequentially formed by a semi-additive method. The wiring layer of the upper surface of the substrate 121 includes the upper surface pads 123, and the wiring layer of the lower surface of the substrate 121 includes the lower surface pads 125. The lower surface pads 125 are provided in positions facing the upper surface pads 133 when the upper wiring substrate 120 is bonded to the intermediate wiring substrate 130. That is, when the upper wiring substrate 120 is bonded to the intermediate wiring substrate 130, the lower surface pads 125 and the upper surface pads 133 facing each other are connected to each other by the connection members 150. The upper surface of the substrate 121 is formed with the solder resist layer 122 having opening portions in positions of the upper surface pads 123, and the lower surface of the substrate 121 is formed with the solder resist layer 124 having opening portions in positions of the lower surface pads 125 (step S202). The solder resist layers 122 and 124 are obtained by laminating photosensitive resin films or applying liquid or paste-like resins on the upper surface and the lower surface of the substrate 121, and exposing/developing the laminated or applied resins and patterning the resins into desired shapes by a photolithography method, for example.

Figure 6:
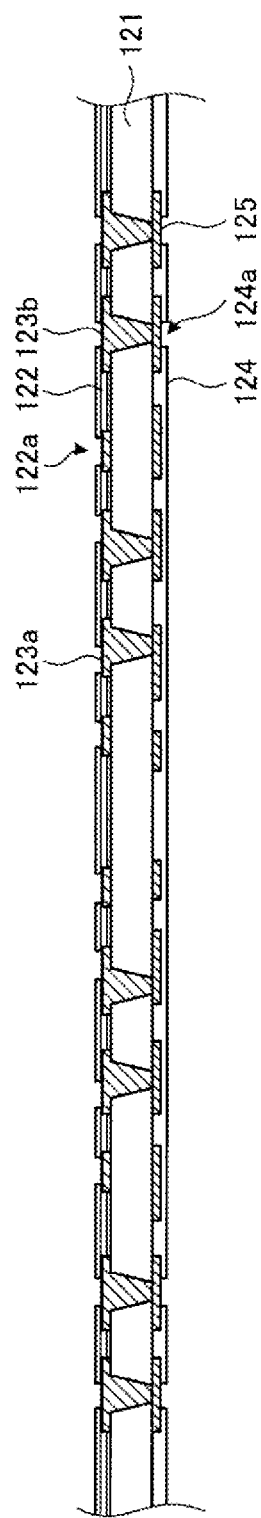
FIG. 6 is a pictorial view depicting a section of the upper wiring substrate.

By the above processes, for example, as shown in FIG. 6, the upper wiring substrate 120 is formed in which in the lower surface of the substrate 121, the lower surface pads 125 are exposed from the opening portions 124*a* of the solder resist layer 124, and in the upper surface of the substrate 121, upper surface pads 123*a* and 123*b* are exposed from the opening portions 122*a* of the solder resist layer 122. FIG. 6 is a pictorial view depicting a section of the upper wiring substrate 120. The upper surface pad 123*a* is a pad for flip chip-connecting the IC chip 104, and the upper surface pad 123*b* is a pad for connecting the terminal of the electronic component 105. A diameter of the opening portion 124*a* from which the lower surface pad 125 is exposed is smaller than a diameter of the opening portion 132*a* on the intermediate wiring substrate 130-side to which the upper wiring substrate 120 is bonded.

Then, the connection members 150 are mounted in positions of the lower surface pads 125 (step S203), which is subjected to reflow processing. Thereby, the connection members 150 are bonded to the lower surface pads 125 by the solders 152 around the cores 151. At this time, since the diameter of the opening portion 124*a* from which the lower surface pad 125 is exposed is smaller than the diameter of the opening portion 132*a* on the intermediate wiring substrate 130-side, movement of the connection member 150 is restricted by the peripheral edge of the opening portion 124*a*, so that the positional misalignment of the connection member 150 can be suppressed.

Figure 7:
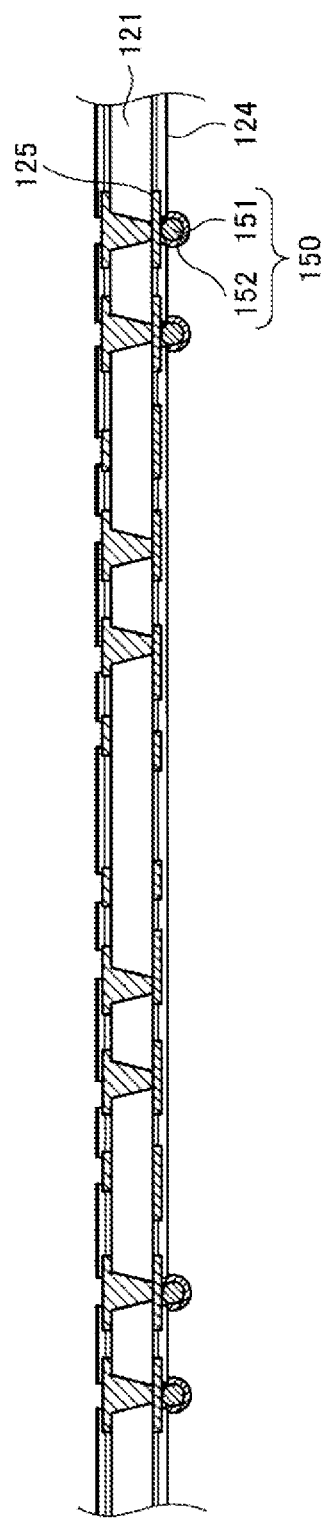
FIG. 7 illustrates a connection member mounting process.

By the above processes, for example, as shown in FIG. 7, the upper wiring substrate 120 where the connection members 150 are bonded to the lower surface pads 125 is formed. Thereby, the upper wiring substrate 120 that forms an upper layer of the component-embedded substrate 100 is obtained. FIG. 7 illustrates a connection member mounting process.

Note that, the upper wiring substrate 120 is preferably manufactured as an assembly in which a plurality of upper wiring substrates 120 is aligned, other than being manufactured as a single body. In the assembly, for example, the upper wiring substrate 120 is manufactured in each of compartments divided into a grid shape.

Figure 8:
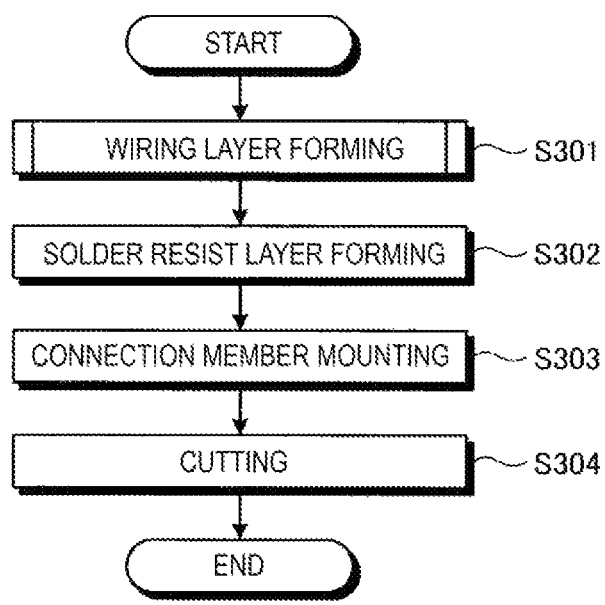
FIG. 8 is a flowchart depicting a manufacturing method of the intermediate wiring substrate.

FIG. 8 is a flowchart depicting a manufacturing method of the intermediate wiring substrate 130.

First, the upper surface and the lower surface of the substrate 131 are formed with the wiring layers (step S301). That is, the substrate 131 is formed with the through-hole wirings 136 penetrating the substrate 131, and the wiring layers of the upper surface and the lower surface of the substrate 131 are formed by copper foils and copper plating. The wiring layer of the upper surface of the substrate 131 includes the upper surface pads 133, and the wiring layer of the lower surface of the substrate 131 includes the lower surface pads 135. The upper surface pads 133 and the lower surface pads 135 are connected to each other by the through-hole wirings 136. The lower surface pads 135 are provided in positions facing the upper surface pads 113 when the intermediate wiring substrate 130 is bonded to the lower wiring substrate 110. That is, when the intermediate wiring substrate 130 is bonded to the lower wiring substrate 110, the lower surface pads 135 and the upper surface pads 113 facing each other are connected to each other by the connection members 140. Note that, a formation process of the upper surface pad 133 and the lower surface pad 135 becoming the wiring layers of the upper surface and the lower surface of the substrate 131 will be described in detail later.

Then, the upper surface of the substrate 131 is formed with the solder resist layer 132 having opening portions in positions of the upper surface pads 133, and the lower surface of the substrate 131 is formed with the solder resist layer 134 having opening portions in positions of the lower surface pad 135 (step S302). The solder resist layers 132 and 134 are obtained by laminating photosensitive resin films or applying liquid or paste-like resins on the upper surface and the lower surface of the substrate 131, and exposing/developing the laminated or applied resins and patterning the resins into desired shapes by a photolithography method, for example.

Figure 9:
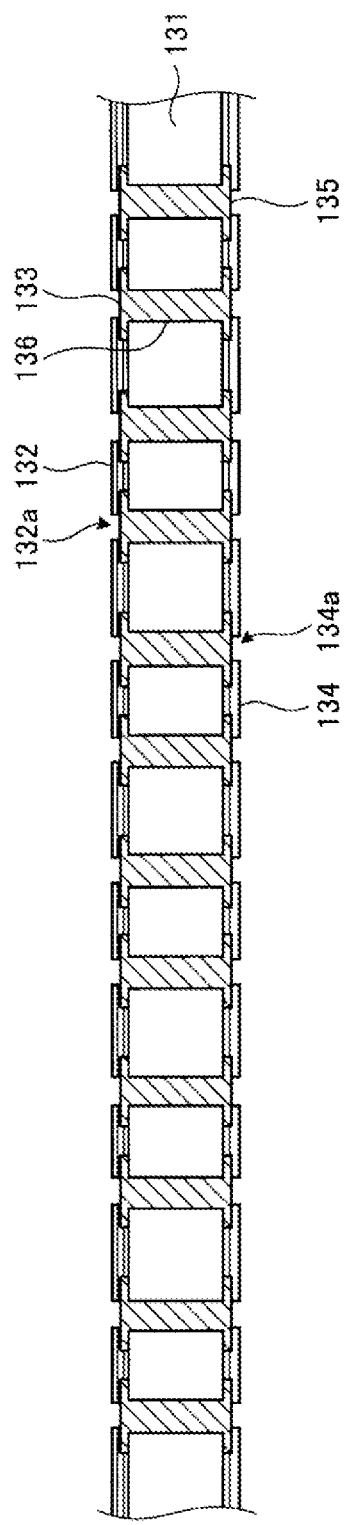
FIG. 9 is a pictorial view depicting a section of the intermediate wiring substrate.

By the above processes, for example, as shown in FIG. 9, the intermediate wiring substrate 130 is formed in which in the lower surface of the substrate 131, the lower surface pads 135 are exposed from the opening portions 134a of the solder resist layer 134, and in the upper surface of the substrate 131, the upper surface pads 133 are exposed from the opening portions 132a of the solder resist layer 122. FIG. 9 is a pictorial view depicting a section of the intermediate wiring substrate 130. A diameter of the opening portion 134a from which the lower surface pad 135 is exposed is smaller than a diameter of the opening portion 112a on the lower wiring substrate 110-side to which the intermediate wiring substrate 130 is bonded. Also, the upper surface pads 133 and the lower surface pads 135 are connected to each other by the through-hole wirings 136 penetrating the substrate 131, and have concave portions in positions corresponding to the through-hole wirings 136.

Then, the connection members 140 are mounted in positions of the lower surface pads 135 (step S303), which is subjected to reflow processing. Thereby, the connection members 140 are bonded to the lower surface pads 135 by the solders 142 around the cores 141. At this time, since the diameter of the opening portion 134a from which the lower surface pad 135 is exposed is smaller than the diameter of the opening portion 112a on the lower wiring substrate 110-side, movement of the connection member 140 is restricted by the peripheral edge of the opening portion 134a, so that the positional misalignment of the connection member 140 can be suppressed. Also, since the concave portion is formed in the position of the lower surface pad 135 corresponding to the through-hole wiring 136, the connection member 140 is accommodated in the concave portion of the lower surface pad 135, so that it is possible to accurately perform positional alignment of the connection member 140 with respect to the intermediate wiring substrate 130.

Figure 10:
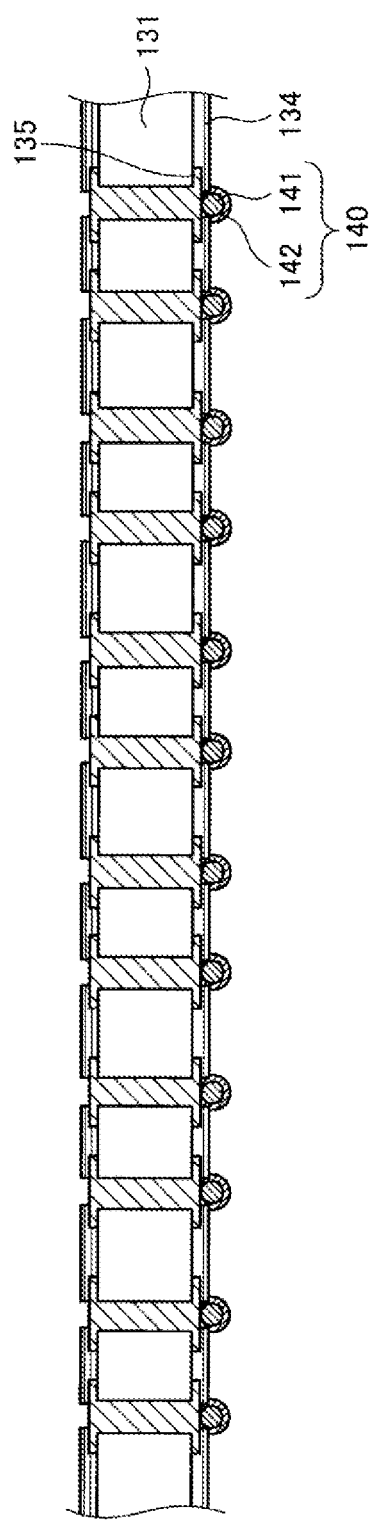
FIG. 10 illustrates a connection member mounting process.

By the above processes, for example, as shown in FIG. 10, the intermediate wiring substrate 130 where the connection members 140 are bonded to the lower surface pads 135 is formed. FIG. 10 illustrates a connection member mounting process.

Figure 11:
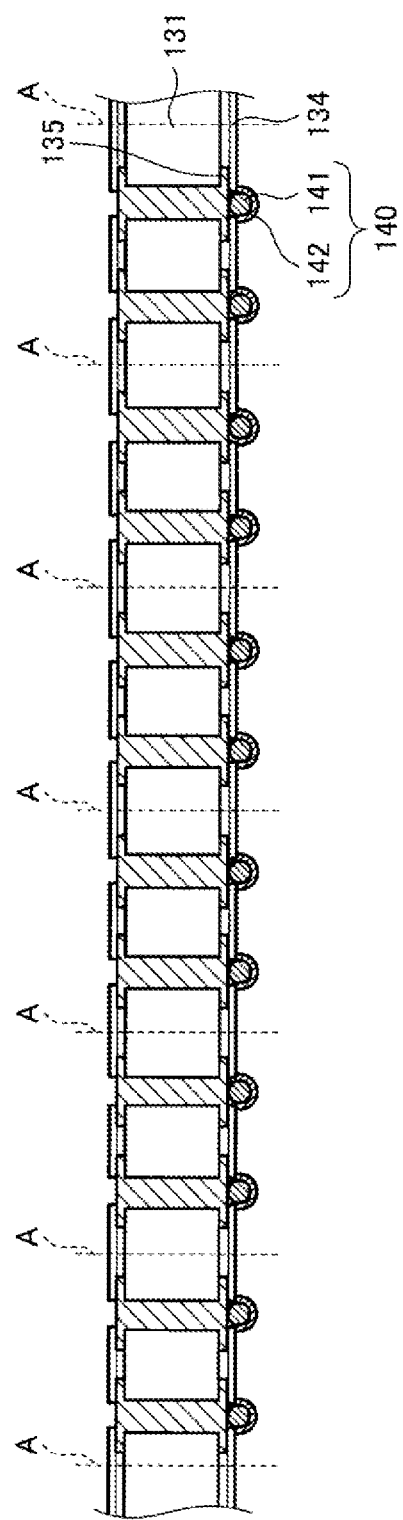
FIG. 11 illustrates a cutting process.

The intermediate wiring substrate 130 in which the connection members 140 are bonded to the lower surface pads 135 is cut by a dicer or a slicer, for example (step S304), so that intermediate wiring substrates 130 each having an appropriate size are obtained. That is, for example, the intermediate wiring substrate 130 shown in FIG. 11 is cut along cutting lines A for demarcating the two connection members 140 aligned in a width direction, so that the intermediate wiring substrates 130, which form an intermediate layer of the component-embedded substrate 100, are obtained. FIG. 11 illustrates a cutting process.

Figure 12:
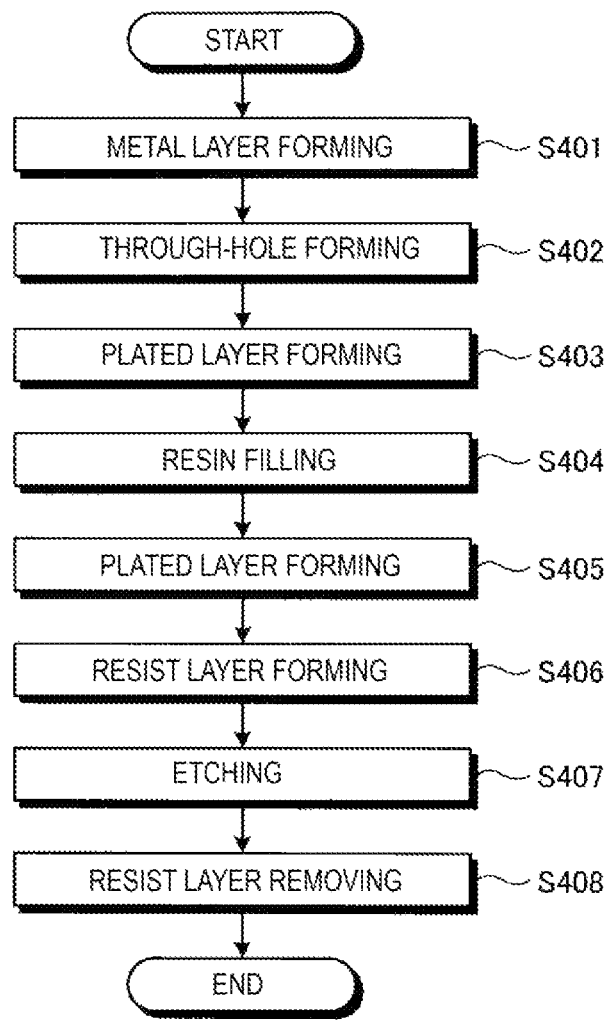
FIG. 12 is a flowchart depicting an example of a wiring layer forming process.

Subsequently, the formation process of the upper surface pad 133 and the lower surface pad 135 becoming the wiring layers of the upper surface and the lower surface of the substrate 131 is described in more detail with reference to FIG. 12. FIG. 12 is a flowchart depicting an example of a wiring layer forming process.

Figure 13:
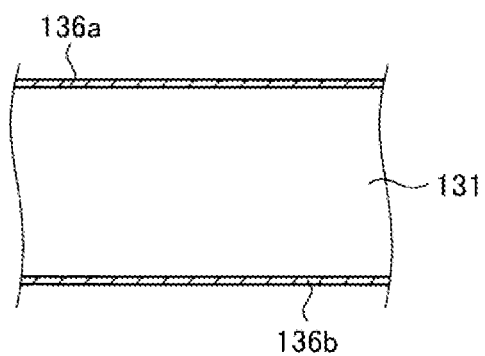
FIG. 13 illustrates a metal layer forming process.

First, the metal layers 136a and 136b are formed on both surfaces of the substrate 131 that is an insulating plate-shaped member (step S401). Specifically, for example, as shown in FIG. 13, the metal layers 136a and 136b of copper or the like are formed on both surfaces of the substrate 131 by depositing copper foils. FIG. 13 illustrates a metal layer forming process.

Figure 14:
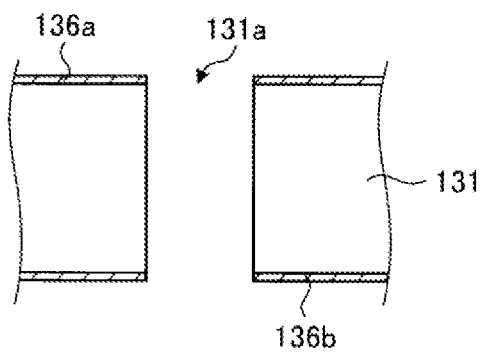
FIG. 14 illustrates a through-hole forming process.

When the metal layers 136a and 136b are formed on both surfaces of the substrate 131, a through-hole penetrating the metal layers 136a and 136b and the substrate 131 is formed (step S402). Specifically, for example, as shown in FIG. 14, a through-hole 131a penetrating the metal layers 136a and 136b and the substrate 131 is formed. FIG. 14 illustrates a through-hole forming process. The through-hole 131a can be formed by laser processing or drill processing, for example.

Figure 15:
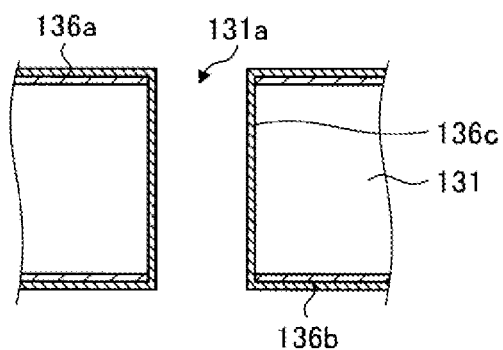
FIG. 15 illustrates a plated layer forming process.

When the through-hole 131a is formed, a plated layer that covers surfaces of the metal layers 136a and 136b and an inner wall surface of the through-hole 131a penetrating the substrate 131 is formed (step S403). That is, electroless copper plating is performed on the surfaces of the metal layers 136a and 136b and the inner wall surface of the through-hole 131a of the substrate 131, and electrolytic copper plating is performed using the electroless copper plating as a power feeding layer. Thereby, for example, as shown in FIG. 15, the surfaces of the metal layers 136a and 136b and the inner wall surface of the through-hole 131a of the substrate 131 are covered by the electroless copper plating and electrolytic copper plating, so that a plated layer 136c is formed. FIG. 15 illustrates a plated layer forming process.

Figure 16:
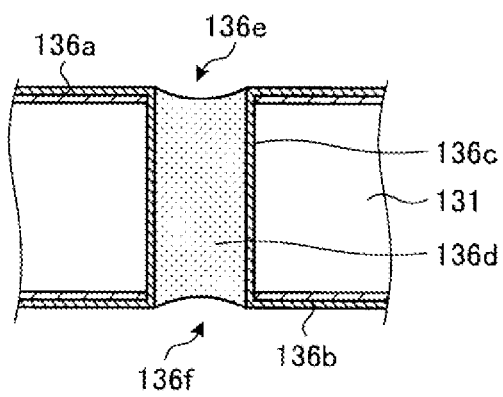
FIG. 16 illustrates a resin filing process.

When the plated layer 136c is formed, the filled resin 136d is filled and thermally cured in the through-hole 131a of the substrate 131 (step S404). In a step where the filled resin 136d is filled and thermally cured in the through-hole 131a of the substrate 131, for example, as shown in FIG. 16, concave portions 136e and 136f are each formed on upper and lower end faces of the filled resin 136d due to heat shrinkage. FIG. 16 illustrates a resin filing process.

Figure 17:
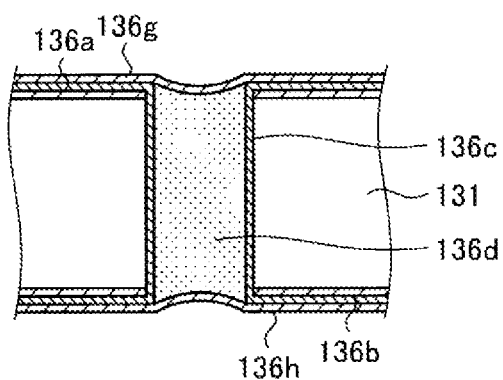
FIG. 17 illustrates the plated layer forming process.

Then, a plated layer that covers the plated layer 136c covering the surfaces of the metal layers 136a and 136b and the upper and lower end faces of the filled resin 136d is formed (step S405). That is, electroless copper plating is performed on the plated layer 136c covering the surfaces of the metal layers 136a and 136b and the upper and lower end faces of the filled resin 136d, and electrolytic copper plating is performed using the electroless copper plating as a power feeding layer. Thereby, for example, as shown in FIG. 17, the plated layer 136c covering the surface of the metal layer 136a and the upper end face of the filled resin 136d are covered by the electroless copper plating and electrolytic copper plating, so that a plated layer 136g is formed. Also, the plated layer 136c covering the surface of the metal layer 136b and the lower end face of the filled resin 136d are covered by the electroless copper plating and electrolytic copper plating, so that a plated layer 136h is formed. FIG. 17 illustrates a plated layer forming process. The plated layers 136g and 136h are each formed along the concave portions 136e and 136f on the upper and lower end faces of the filled resin 136d. For this reason, the plated layers 136g and 136h each have concave portions in positions of the concave portions 136e and 136f of the upper and lower end faces of the filled resin 136d.

Figure 18:
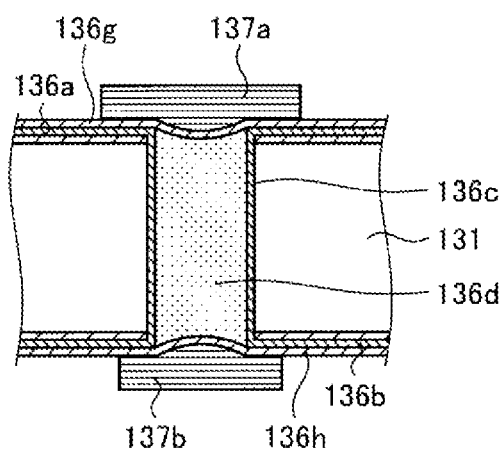
FIG. 18 illustrates a resist layer forming process.

When the plated layers 136g and 136h are formed, resist layers for etching are each formed on surfaces of the plated layers 136g and 136h (step S406). That is, for example, as shown in FIG. 18, resist layers 137a and 137b each having patterns of shapes corresponding to the wiring layers of the upper surface and the lower surface of the substrate 131 are formed on surfaces of the plated layers 136g and 136h. FIG. 18 illustrates a resist layer forming process. The resist layers 137a and 137b are formed by laminating photosensitive dry films on the surfaces of the plated layers 136g and 136h and patterning the dry films by a photolithography method, for example.

Figure 19:
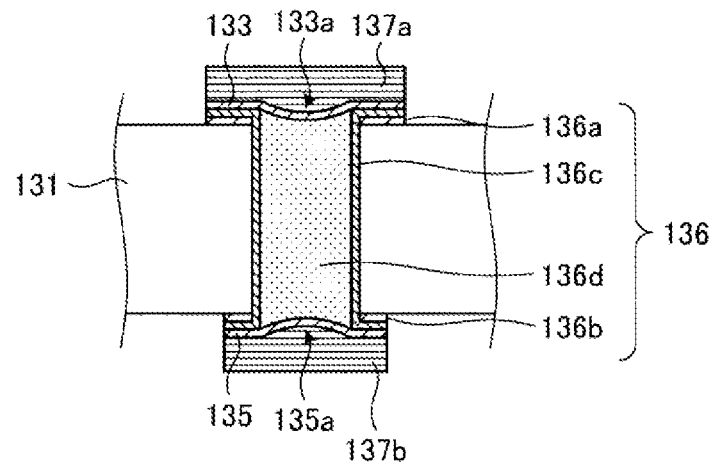
FIG. 19 illustrates an etching process.

When the resist layers 137a and 137b are formed, the plated layers 136g and 136h, the plated layer 136c and the metal layers 136a and 136b are etched using the resist layers 137a and 137b as a mask (step S407). That is, the plated layers 136g and 136h, the plated layer 136c and the metal layers 136a and 136b of parts except the resist layers 137a and 137b are removed by etching, so that the wiring layers of the upper surface and the lower surface of the substrate 131 are formed, as shown in FIG. 19, for example. The wiring layer of the upper surface of the substrate 131 includes the upper surface pad 133, and the wiring layer of the lower surface of the substrate 131 includes the lower surface pad 135. By the etching, the through-hole wiring 136 penetrating the substrate 131 is also formed in the substrate 131, as shown in FIG. 19, for example. The upper surface pad 133 and the lower surface pad 135 are connected to each other by the through-hole wiring 136. FIG. 19 illustrates an etching process. Here, as described above, the plated layers 136g and 136h each have the concave portions in positions of the concave portions 136e and 136f on the upper and lower end faces of the filled resin 136d of the through-hole wiring 136. For this reason, concave portions 133a and 135a are each formed in positions of the upper surface pad 133 and the lower surface pad 135 corresponding to the through-hole wiring 136. That is, the upper surface pad 133 to which the connection member 150 will be bonded in a later process and the lower surface pad 135 to which the connection member 140 will be bonded in a later process are each formed with the concave portions 133a and 135a.

Figure 20:
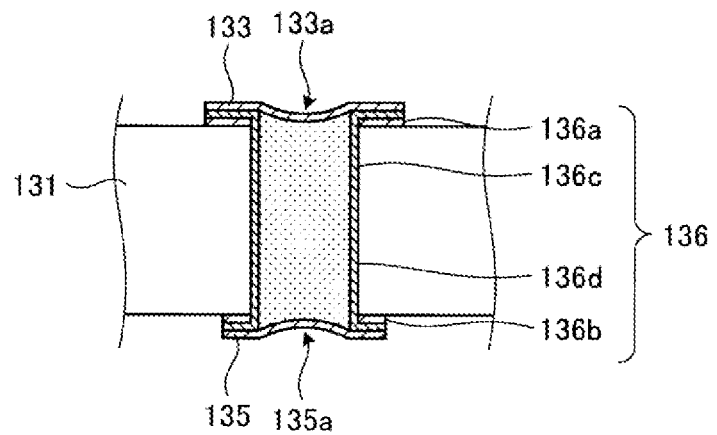
FIG. 20 illustrates a resist layer removing process.

Then, the resist layers 137a and 137b are removed (step S408). That is, the resist layers 137a and 137b are removed by an alkaline peeling solution, for example, so that the upper surface pad 133 and the lower surface pad 135 are exposed on the upper surface and the lower surface of the substrate 131, as shown in FIG. 20, for example. FIG. 20 illustrates a resist layer removing process. By the above processes, the upper surface pad 133 and the lower surface pad 135 becoming the wiring layers of the upper surface and the lower surface of the substrate 131 are obtained.

Figure 21:
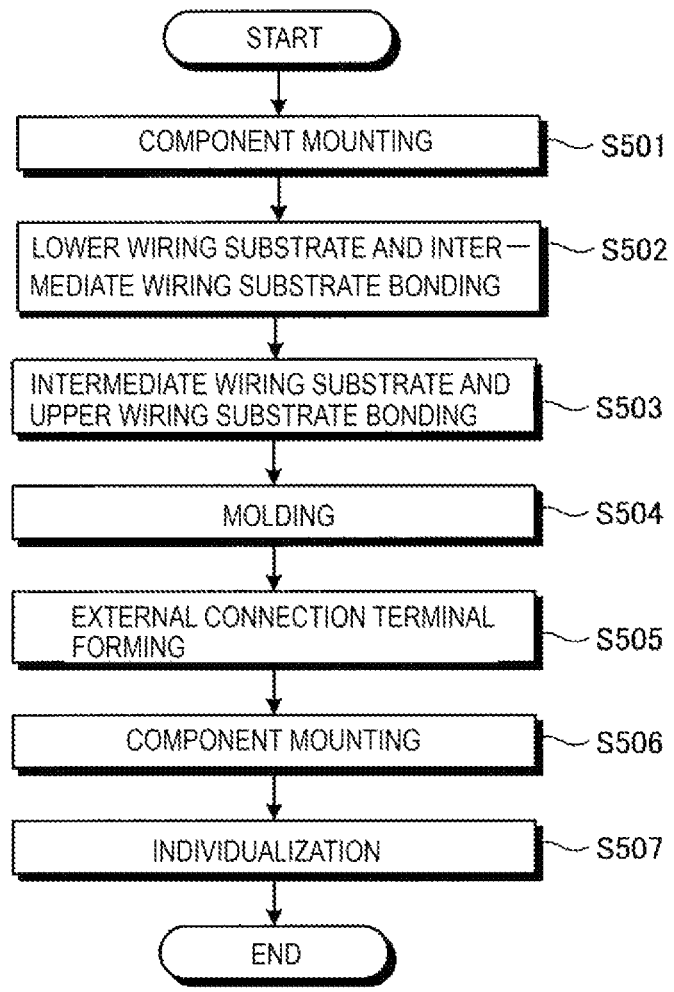
FIG. 21 is a flowchart depicting a manufacturing method of a component-embedded substrate.

FIG. 21 is a flowchart depicting a manufacturing method of the component-embedded substrate 100. The component-embedded substrate 100 is manufactured using the lower wiring substrate 110, the upper wiring substrate 120 and the intermediate wiring substrate 130.

Figure 22:
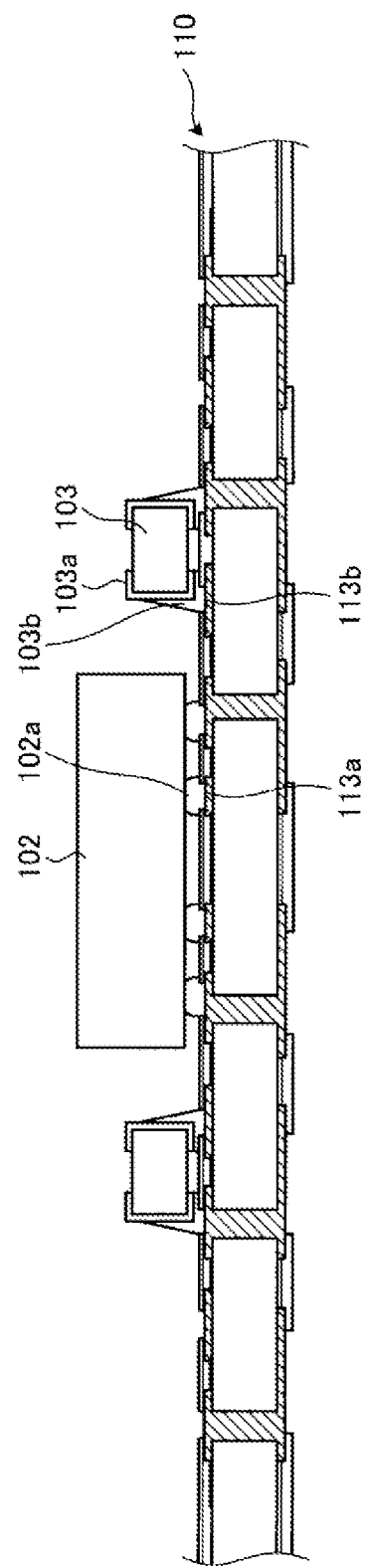
FIG. 22 illustrates component mounting.

First, the IC chip 102 and the electronic components 103 are mounted on the upper surface of the lower wiring substrate 110 (step S501), which is then subjected to reflow processing and the IC chip 102 and the electronic components 103 are mounted on the lower wiring substrate 110. That is, for example, as shown in FIG. 22, the terminals of the IC chip 102 are flip chip-connected to the upper surface pads 113a by the solder balls 102a, so that the IC chip 102 is mounted on the upper surface of the lower wiring substrate 110. The terminals 103a of the electronic components 103 are also connected to the upper surface pads 113b by the solders 103b, so that the electronic components 103 are mounted on the upper surface of the lower wiring substrate 110. FIG. 22 illustrates component mounting. As the electronic components 103, passive components such as a capacitor, an inductor, a resistor element and the like can be used, for example. The electronic components 103 may also include active components such as an IC chip, for example.

Figure 23:
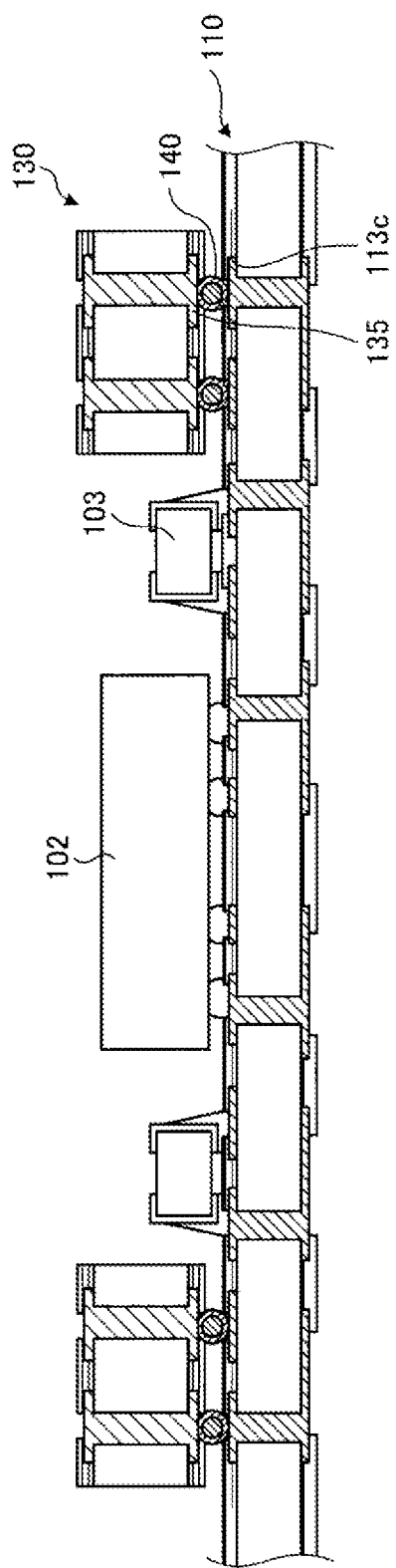
FIG. 23 illustrates a bonding process.

Then, the intermediate wiring substrates 130 are arranged around the IC chip 102 and the electronic components 103 on the lower wiring substrate 110, and the lower wiring substrate 110 and the intermediate wiring substrates 130 are bonded to each other (step S502). Specifically, the connection members 140 bonded to the lower surface pads 135 of the intermediate wiring substrates 130 are bonded to the upper surface pads 113c of the lower wiring substrate 110 by reflow processing, for example. Thereby, for example, as shown in FIG. 23, the lower wiring substrate 110 and the intermediate wiring substrates 130 are bonded to each other by the connection members 140. FIG. 23 illustrates a bonding process.

Figure 24:
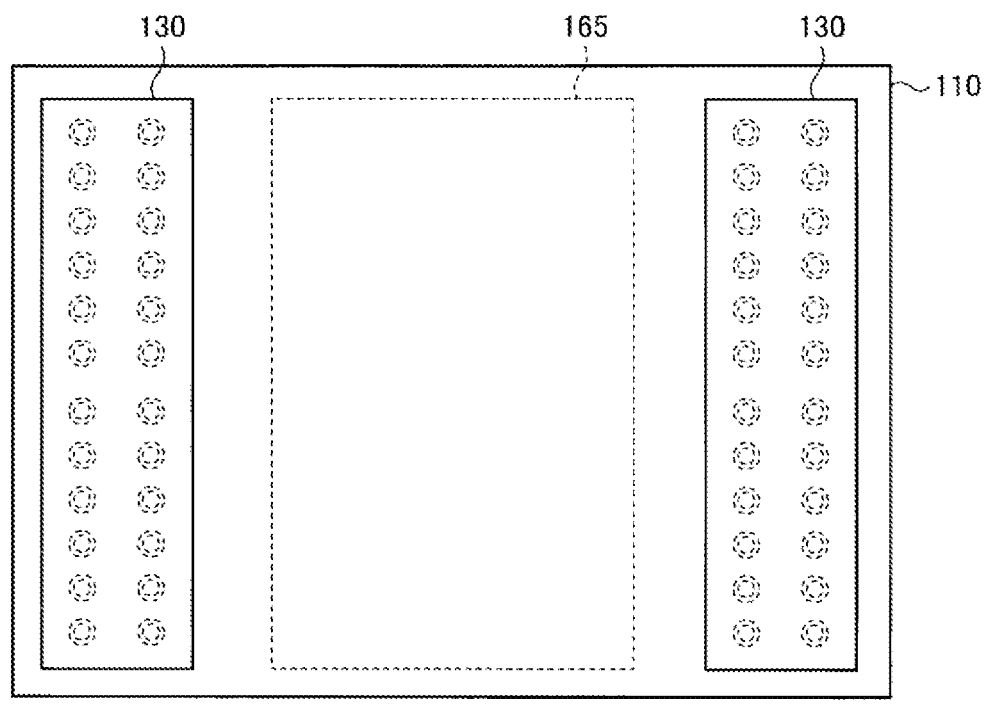
FIG. 24 is a plan view of the lower wiring substrate, as seen from above.

Here, positions in which the intermediate wiring substrates 130 are arranged are described with reference to FIG. 24. FIG. 24 is a plan view of the lower wiring substrate 110, as seen from above. As shown in FIG. 24, a component mounting area 165 in which the IC chip 102 and the electronic components 103 are mounted is set for the upper surface of the lower wiring substrate 110. For example, the component mounting area 165 is provided at a center of the upper surface of the lower wiring substrate 110. Note that, in FIG. 24, the IC chip 102 and the electronic components 103 mounted in the component mounting area 165 are not shown. The intermediate wiring substrates 130 are arranged in positions in which the quadrangular component mounting area 165 is sandwiched therebetween, for example. That is, the intermediate wiring substrates 130 are arranged along two facing sides of the component mounting area 165. In other words, the intermediate wiring substrates 130 are arranged in areas between the outer peripheral edge of the upper surface of the lower wiring substrate 110 and the component mounting area 165.

The order of the component mounting process (step S501) and the bonding process (step S502) can be reversed. That is, after bonding the lower wiring substrate 110 and the intermediate wiring substrates 130, the IC chip 102 and the electronic components 103 may be mounted in positions in which they are sandwiched by the intermediate wiring substrates 130. The component mounting process and the bonding process may also be performed at the same time.

Figure 25:
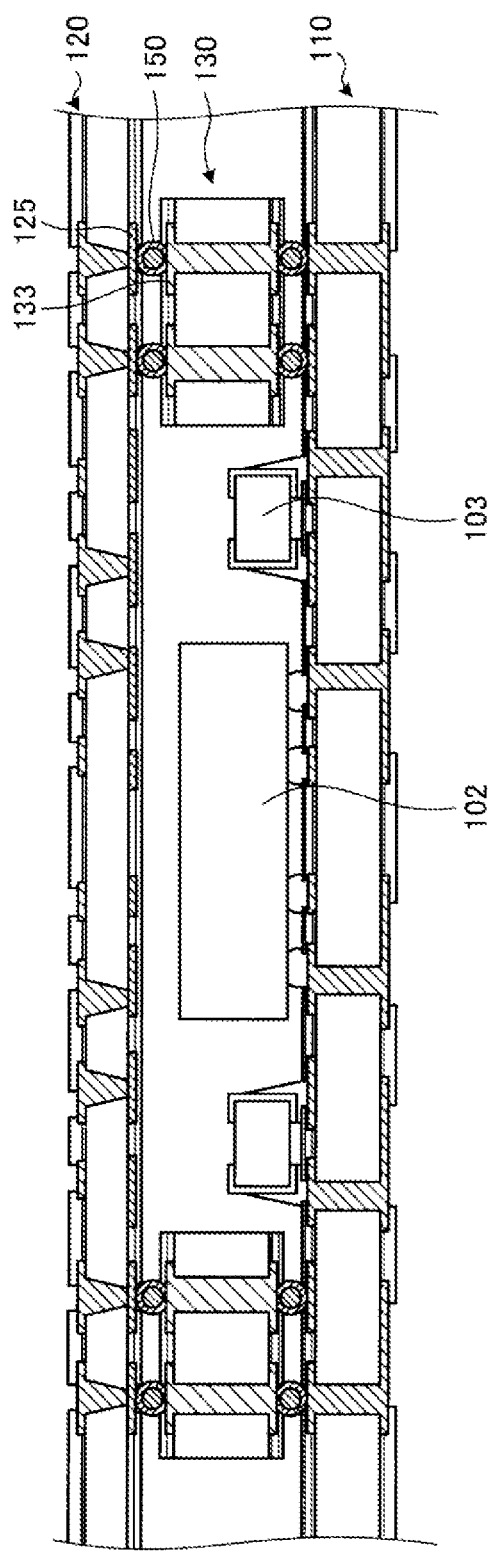
FIG. 25 illustrates the bonding process.

When the lower wiring substrate 110 and the intermediate wiring substrates 130 are bonded to each other, the upper wiring substrate 120 is arranged above the intermediate wiring substrates 130, and the intermediate wiring substrates 130 and the upper wiring substrate 120 are bonded to each other by a TCB (Thermal Compression Bonding) method, for example (step S503). Specifically, the connection members 150 bonded to the lower surface pads 125 of the upper wiring substrate 120 are bonded to the upper surface pads 133 of the intermediate wiring substrates 130 by heat and pressure. Thereby, for example, as shown in FIG. 25, the lower wiring substrate 110, the upper wiring substrate 120 and the intermediate wiring substrates 130 are integrated. FIG. 25 illustrates a bonding process. The IC chip 102 and the electronic components 103 are sandwiched by the lower wiring substrate 110 and the upper wiring substrate 120, and the intermediate wiring substrates 130 are interposed between the lower wiring substrate 110 and the upper wiring substrate 120. An interval between the lower wiring substrate 110 and the upper wiring substrate 120 can be adjusted as appropriate according to a thickness of the intermediate wiring substrates 130 and diameters of the connection members 140 and 150. Note that, FIG. 24 depicts arrangement of the connection members 140 and 150 on the upper and lower surfaces of the intermediate wiring substrate 130 by the broken lines. The plurality of connection members 140 and 150 may be provided in a plurality of rows or in a grid shape on the upper and lower surfaces of the intermediate wiring substrate 130.

Figure 26:
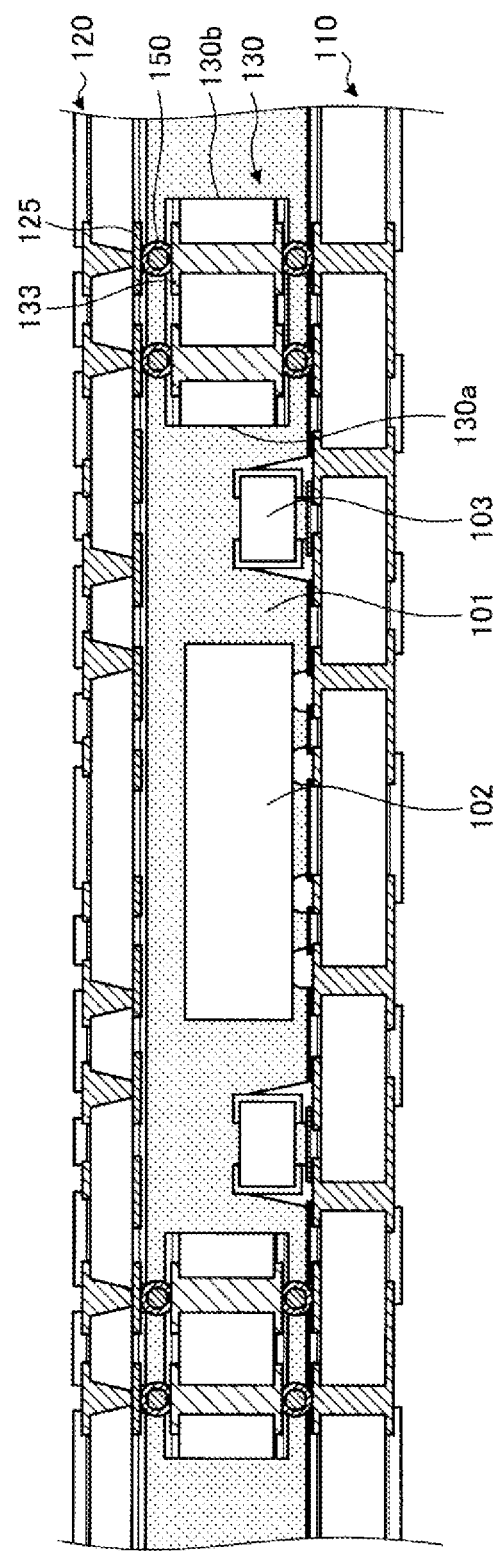
FIG. 26 illustrates a molding process.

Then, transfer molding is performed, for example (step S504), so that the encapsulating resin 101 is filled in a space between the lower wiring substrate 110 and the upper wiring substrate 120. During the transfer molding, the bonded lower wiring substrate 110, upper wiring substrate 120 and intermediate wiring substrates 130 are accommodated in a mold, and the fluidized encapsulating resin 101 is injected into the mold. Then, the encapsulating resin 101 is heated and cured to a predetermined temperature. Thereby, for example, as shown in FIG. 26, the encapsulating resin 101 is filled in the space between the lower wiring substrate 110 and the upper wiring substrate 120, and the intermediate wiring substrates 130 are entirely encapsulated by the encapsulating resin 101 together with the IC chip 102 and the electronic components 103. For this reason, the side surfaces 130b of the intermediate wiring substrates 130 positioned on an opposite side to the IC chip 102 and the electronic components 103 are covered by the encapsulating resin 101, so that the interfaces between the intermediate wiring substrates 130 and the encapsulating resin 101 are isolated from an external environment. As a result, it is possible to suppress moisture from being introduced into the component-embedded substrate 100 from the interfaces between the intermediate wiring substrates 130 and the encapsulating resin 101. FIG. 26 illustrates a molding process.

Note that, while the transfer molding is performed, the encapsulating resin 101 is filled in a space between the lower wiring substrate 110 and the electronic component (the IC chip 102 and the electronic components 103). The encapsulating resin 101 is also filled in a space between the upper surface of the lower wiring substrate 110 and the lower surface of the intermediate wiring substrate 130. The encapsulating resin 101 is also filled in a space between the lower surface of the upper wiring substrate 120 and the upper surface of the intermediate wiring substrate 130.

Figure 27:
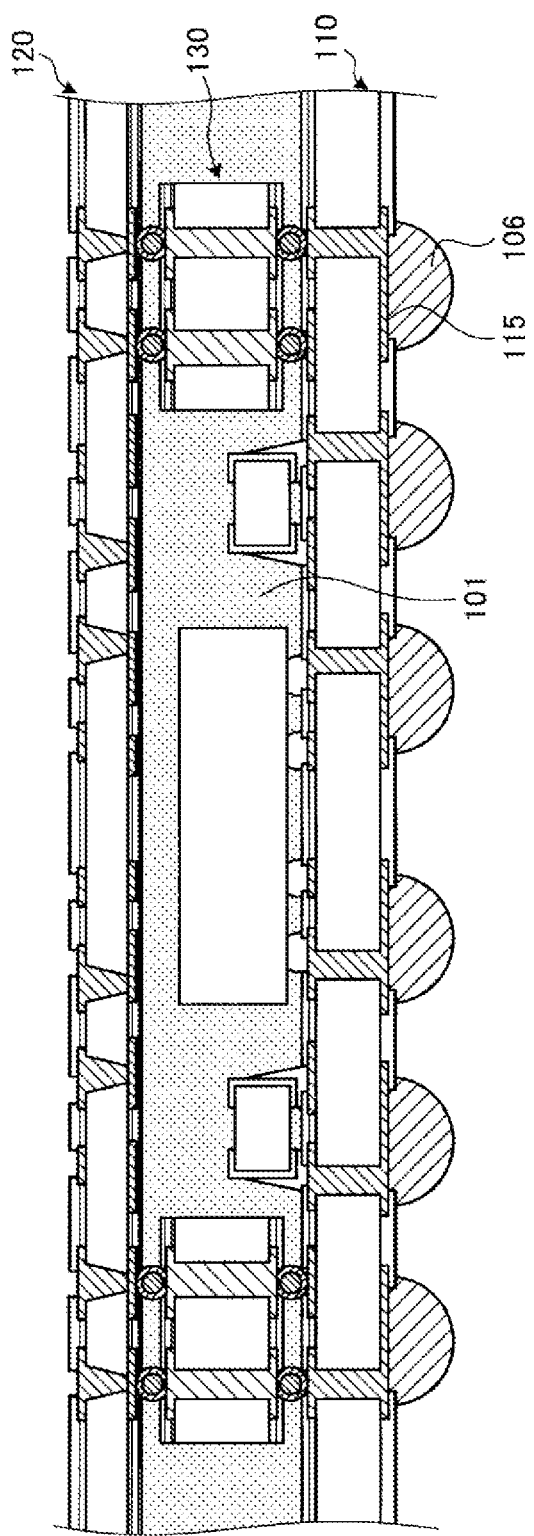
FIG. 27 illustrates a terminal forming process.

When the intermediate wiring substrates 130, the IC chip 102 and the electronic components 103 are encapsulated, external connection terminals are formed on the lower surface of the lower wiring substrate 110 (step S505). Specifically, for example, as shown in FIG. 27, the external connection terminals such as solder balls 106 are formed on the lower surface pads 115 of the lower wiring substrate 110. FIG. 27 illustrates a terminal forming process.

Figure 28:
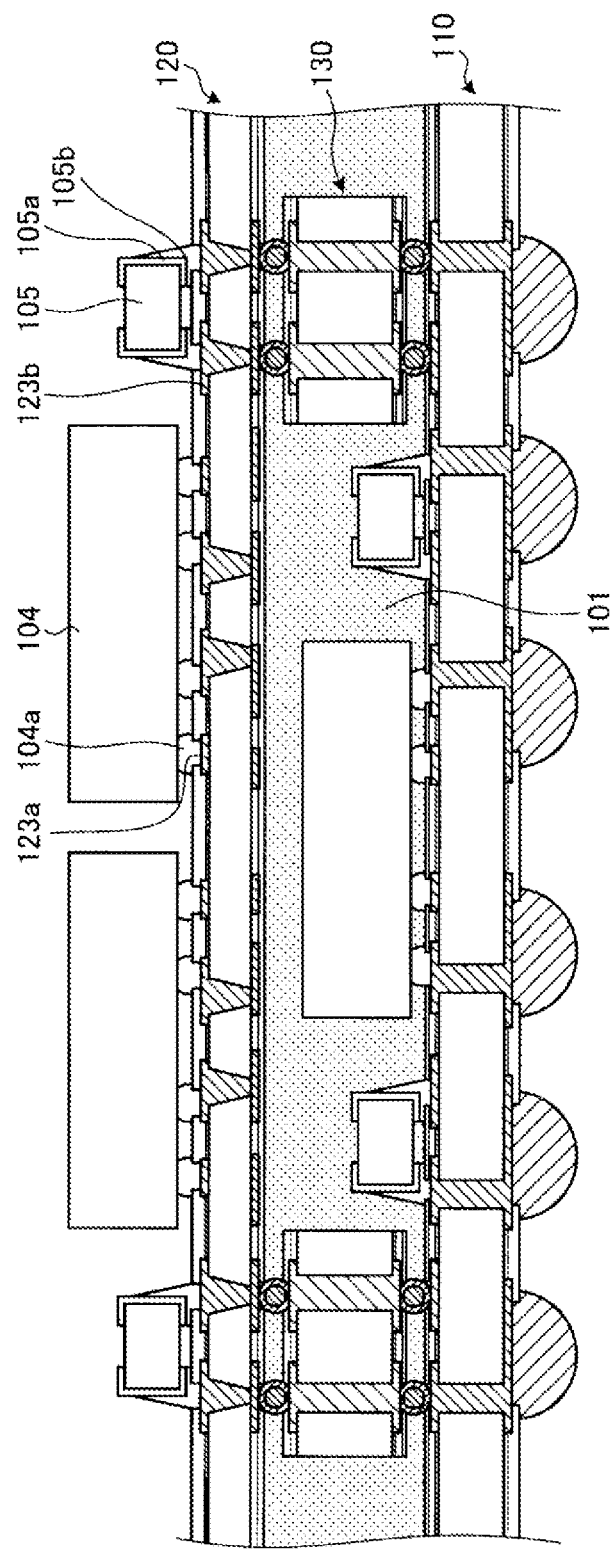
FIG. 28 illustrates component mounting.

When the external connection terminals are formed, the IC chips 104 and the electronic components 105 are mounted on the upper surface of the upper wiring substrate 120 (step S506), which is then subjected to reflow processing and the IC chips 104 and the electronic components 105 are mounted on the upper wiring substrate 120. That is, for example, as shown in FIG. 28, the terminals of the IC chips 104 are flip chip-connected to the upper surface pads 123a by the solder balls 104a, so that the IC chips 104 are mounted on the upper surface of the upper wiring substrate 120. The terminals 105a of the electronic components 105 are also connected to the upper surface pads 123b by the solders 105b, so that the electronic components 105 are mounted on the upper surface of the upper wiring substrate 120. FIG. 28 illustrates component mounting. As the electronic components 105, passive components such as a capacitor, an inductor, a resistor element and the like can be used, for example. The electronic components 105 may also include active components such as an IC chip, for example.

Figure 29:
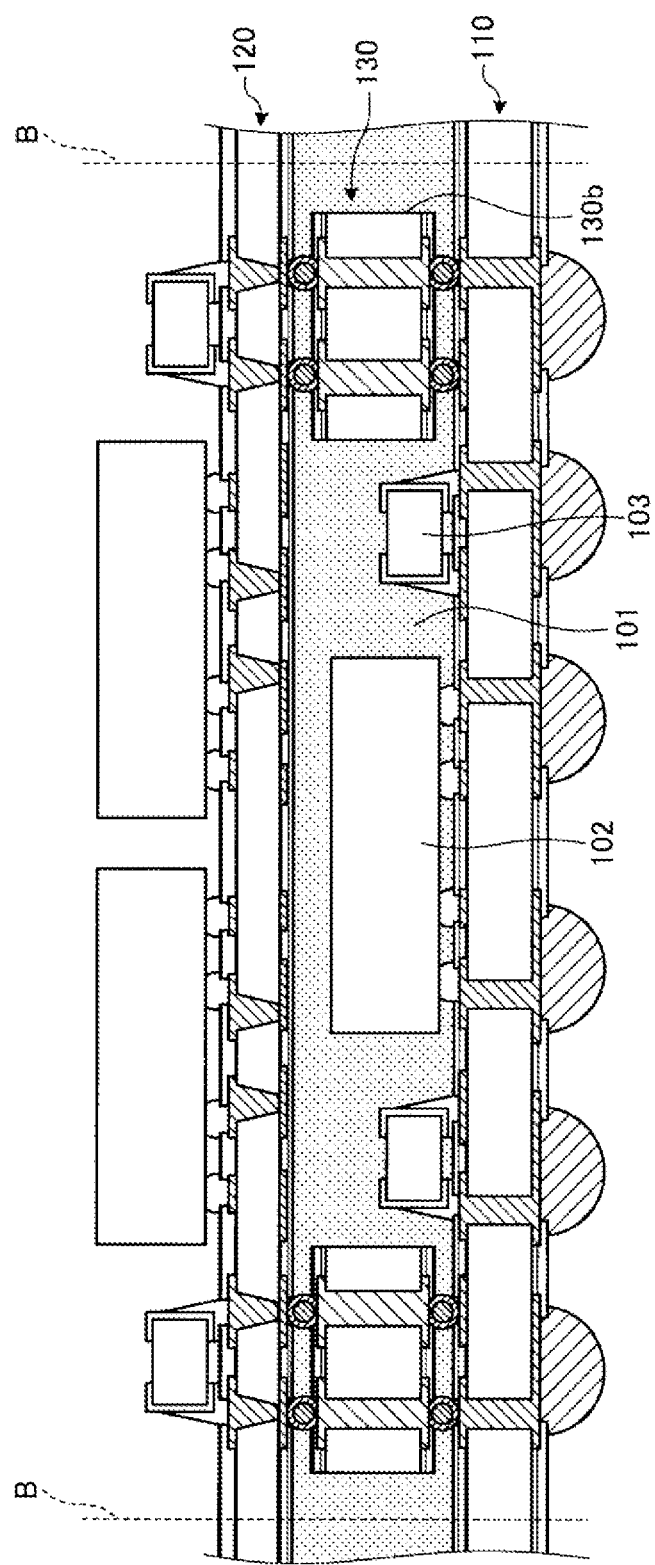
FIG. 29 illustrates an individualizing process.

By the above processes, an intermediate structure having a structure equivalent to the component-embedded substrate 100 is obtained. Since the intermediate structure is configured by an assembly including the plurality of lower wiring substrates 110 and an assembly including the plurality of upper wiring substrates 120, an individualizing process of cutting each of the lower wiring substrates 110 and the upper wiring substrates 120 from the intermediate structure is performed (step S507). Specifically, the intermediate structure shown in FIG. 29 is cut at cutting lines B more distant from the IC chip 102 and the electronic components 103 than the side surfaces 130b of the intermediate wiring substrates 130 by a dicer or a slicer, for example, so that the component-embedded substrate 100 is obtained. Since the cutting lines B are more distant from the IC chip 102 and the electronic components 103 than the side surfaces 130b of the intermediate wiring substrates 130, the side surfaces 130b of the intermediate wiring substrates are not exposed from the encapsulating resin 101 on side surfaces of the component-embedded substrate 100. FIG. 29 illustrates an individualizing process.

As described above, the component-embedded substrate of the embodiment includes a first wiring substrate (for example, the lower wiring substrate 110), an electronic component (for example, the IC chip 102 and the electronic components 103), an intermediate wiring substrate, a second wiring substrate (for example, the upper wiring substrate 120), and an encapsulating resin. The electronic component is provided on the first wiring substrate. The intermediate wiring substrate is provided around the electronic component on the first wiring substrate, and is connected to the first wiring substrate via a first connection member (for example, the connection member 140). The second wiring substrate is provided above the first wiring substrate, the electronic component and the intermediate wiring substrate, and is connected to the intermediate wiring substrate via a second connection member (for example, the connection member 150). The encapsulating resin is filled between the first wiring substrate and the second wiring substrate to cover the electronic component and the intermediate wiring substrate.

The intermediate wiring substrate has a first side surface (for example, the side surface 130a), and a second side surface (for example, the side surface 130b). The first side surface is positioned around the electronic component, and is covered by the encapsulating resin. The second side surface is positioned on an opposite side to the first side surface, and is covered by the encapsulating resin. Thereby, the interface between the intermediate wiring substrate and the encapsulating resin is not exposed to the external environment on the side surfaces of the component-embedded substrate. As a result, it is possible to suppress moisture from being introduced into the component-embedded substrate. Also, moisture is suppressed from being introduced into the component-embedded substrate, so that it is possible to prevent occurrence of a popcorn phenomenon and a migration phenomenon in the component-embedded substrate. Thereby, it is possible to improve reliability of the component-embedded substrate.

Also, in the component-embedded substrate of the embodiment, the first wiring substrate includes a first substrate (for example, the substrate 111), a first pad (for example, the upper surface pad 113), and a first insulation layer (for example, the solder resist layer 112). The first pad is formed on a wiring layer of an upper surface of the first substrate and connects a first connection member. The first insulation layer covers the upper surface of the first substrate and is formed at a portion with an opening portion for exposing the first pad. The intermediate wiring substrate includes a second substrate (for example, the substrate 131), a second pad (for example, the lower surface pad 135), and a second insulation layer (for example, the solder resist layer 134). The second pad is formed on a wiring layer of a lower surface of the second substrate and connects the first connection member. The second insulation layer covers the lower surface of the substrate and is formed at a portion with an opening portion for exposing the second pad. A diameter of the opening portion of the second insulation layer is smaller than a diameter of the opening portion of the first insulation layer. Thereby, it is possible to suppress positional misalignment of the first connection member with respect to the second pad, and to prevent bad connection between the first wiring substrate and the intermediate wiring substrate that are connected by the first connection member.

Also, in the component-embedded substrate of the embodiment, the intermediate wiring substrate includes a third pad (for example, the upper surface pad 133), and a third insulation layer (for example, the solder resist layer 132). The third pad is formed on a wiring layer of an upper surface of the second substrate, and connects the second connection member. The third insulation layer covers the upper surface of the second substrate, and is formed at a portion with an opening portion for exposing the third pad. The second wiring substrate includes a third substrate (for example, the substrate 121), a fourth pad (for example, the lower surface pad 125), and a fourth insulation layer (for example, the solder resist layer 124). The fourth pad is formed on a wiring layer of a lower surface of the third substrate, and connects the second connection member. The fourth insulation layer covers the lower surface of the third substrate, and is formed at a portion with an opening portion for exposing the fourth pad. A diameter of the opening portion of the fourth insulation layer is smaller than a diameter of the opening portion of the third insulation layer. Thereby, it is possible to suppress positional misalignment of the second connection member with respect to the fourth pad, and to prevent bad connection between the intermediate wiring substrate and the second wiring substrate that are connected by the second connection member.

Also, in the component-embedded substrate of the embodiment, the second pad and the third pad are connected to each other by a through-wiring (for example, the through-hole wiring 136) penetrating the second substrate, and has concave portions in positions corresponding to the through-wiring. Thereby, since the first connection member is accommodated in the concave portion of the second pad, it is possible to accurately perform positional alignment of the first connection member with respect to the intermediate wiring substrate. Also, since the second connection member is accommodated in the concave portion of the third pad, it is possible to accurately perform positional alignment of the second connection member with respect to the intermediate wiring substrate.

Also, in the component-embedded substrate of the embodiment, the first connection member and the second connection member are arranged in positions overlapping each other, when seeing the intermediate wiring substrate in the thickness direction. Thereby, an electrical distance between the first wiring substrate and the second wiring substrate that are connected via the intermediate wiring substrate is minimized, so that an impedance between the first wiring substrate and the second wiring substrate can be reduced.

Figure 30:
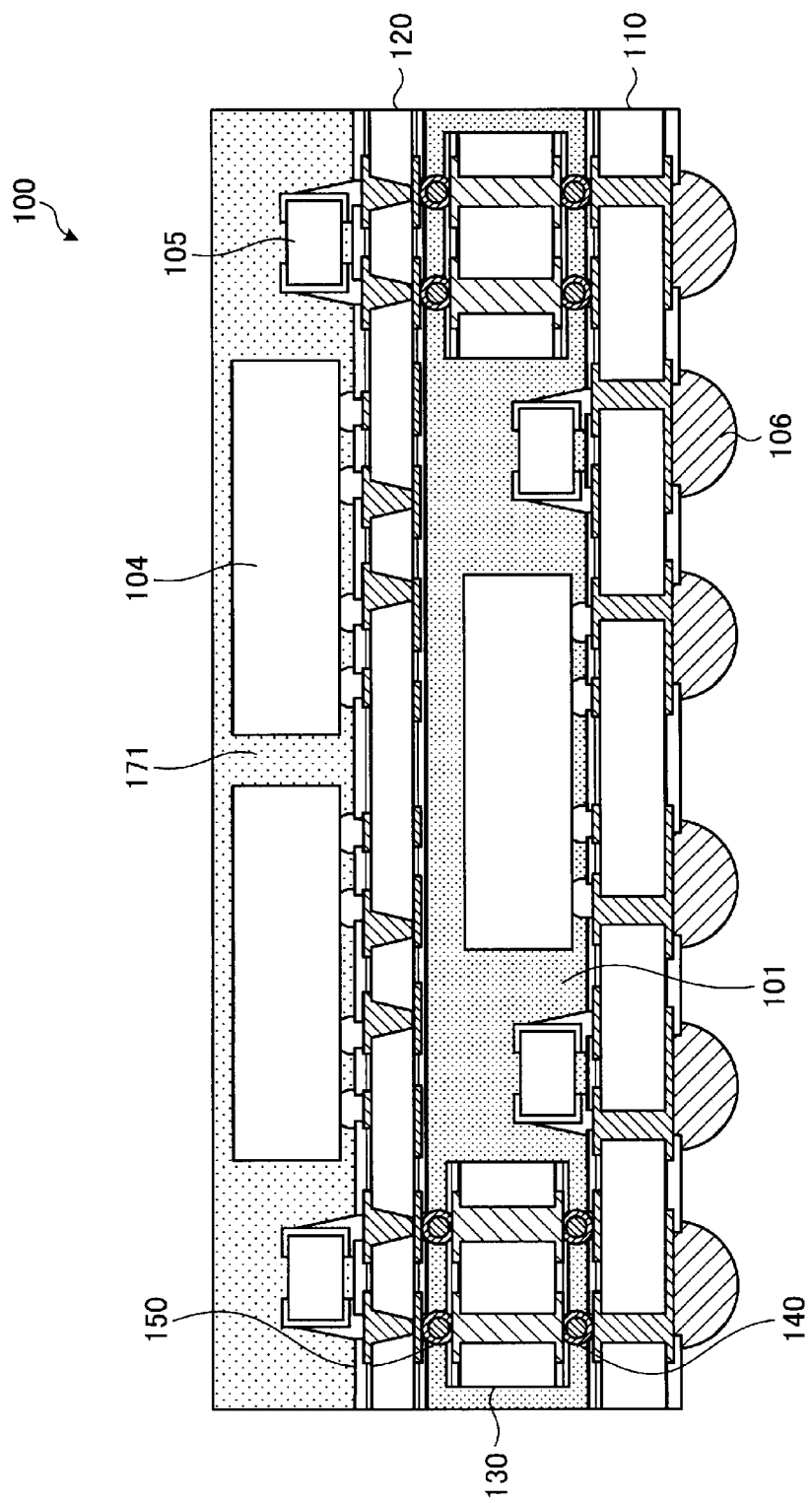
FIG. 30 depicts Modified Embodiment 1 of the component-embedded substrate.

Note that, in the embodiment, the IC chips 104 and the electronic components 105 mounted on the upper surface of the upper wiring substrate 120 are exposed but the IC chips 104 and the electronic components 105 may also be encapsulated by the encapsulating resin. That is, for example, as shown in FIG. 30, the component-embedded substrate 100 may include an encapsulating resin 171 that covers the IC chips 104 and the electronic components 105 mounted on the upper surface of the upper wiring substrate 10. FIG. 30 depicts Modified Embodiment 1 of the component-embedded substrate 100.

Figure 31:
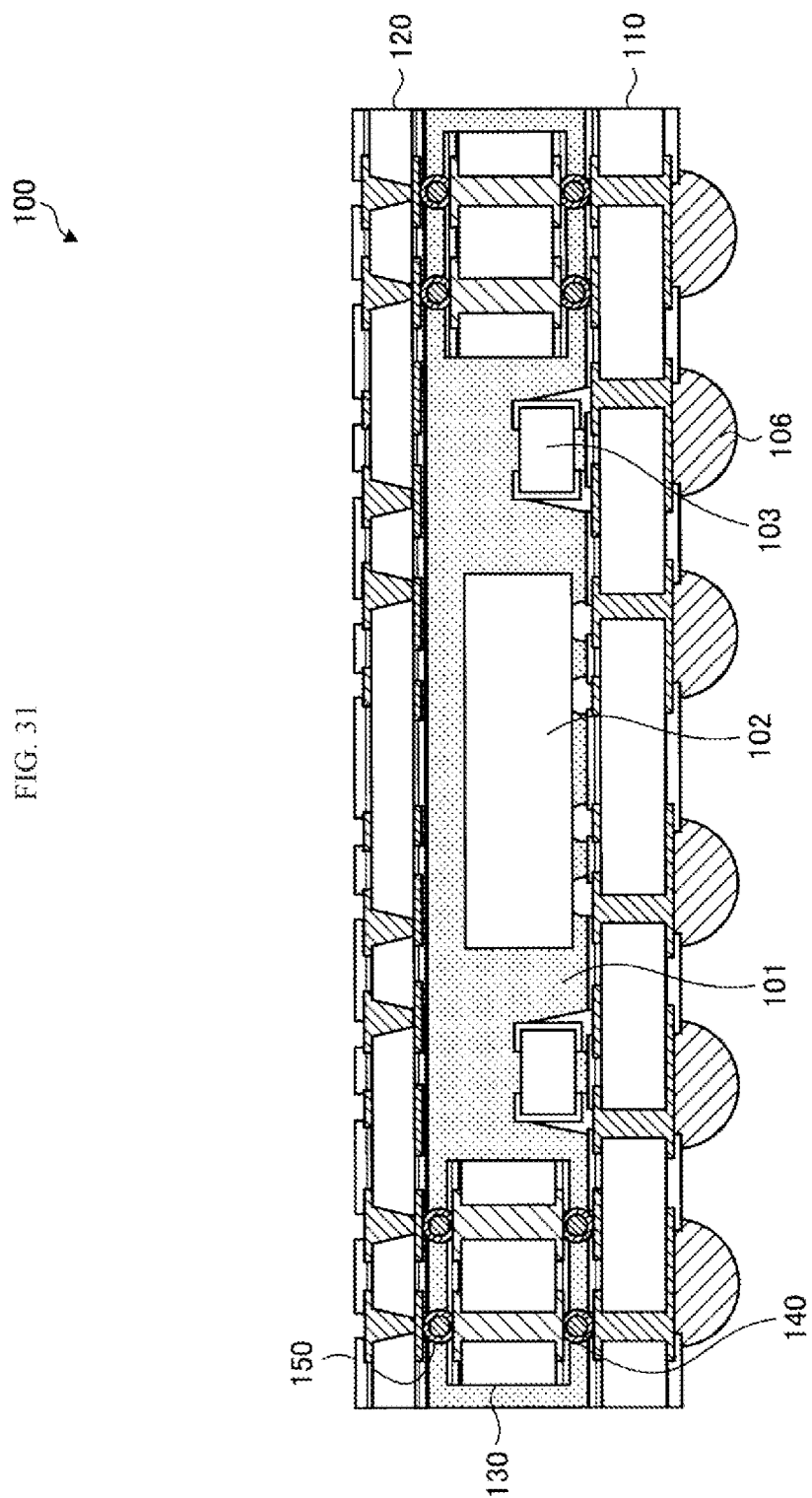
FIG. 31 depicts Modified Embodiment 2 of the component-embedded substrate.
Figure 32:
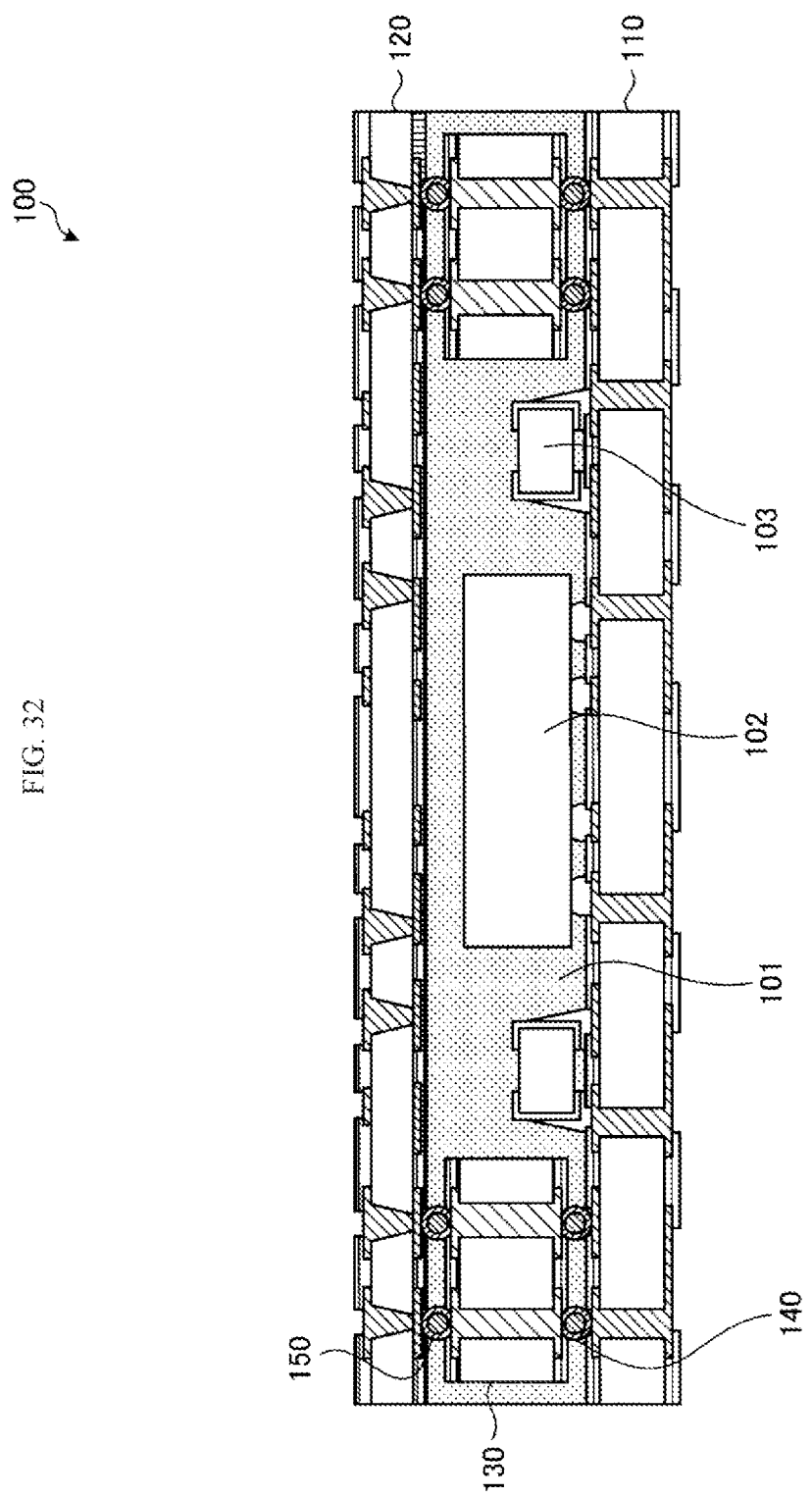
FIG. 32 depicts Modified Embodiment 3 of the component-embedded substrate.

Also, in the embodiment, the IC chips 104 and the electronic components 105 are mounted on the upper surface of the upper wiring substrate 120 but the mounting of the IC chips 104 and the electronic components 105 on the upper surface of the upper wiring substrate 120 may be omitted. That is, for example, as shown in FIG. 31, the component-embedded substrate 100 may not have the electronic component on the upper surface of the upper wiring substrate 120, and may have the IC chip 102 and the electronic components 103 encapsulated by the encapsulating resin 101 only between the lower wiring substrate 110 and the upper wiring substrate 120. FIG. 31 depicts Modified Embodiment 2 of the component-embedded substrate 100. Also, the mounting of the IC chips 104 and the electronic components 105 on the upper surface of the upper wiring substrate 120, and the formation of the external connection terminals on the lower surface of the lower wiring substrate 110 may be omitted. That is, for example, as shown in FIG. 32, the component-embedded substrate 100 may not have the electronic component on the upper surface of the upper wiring substrate 120 and may not also have the external connection terminals on the lower surface of the lower wiring substrate 110. In this case, the lower surface pad 115 of the lower wiring substrate 110 has a function as the external connection terminal. FIG. 32 depicts Modified Embodiment 3 of the component-embedded substrate 100. Also, in a case where the mounting of the IC chips 104 and the electronic components 105 on the upper surface of the upper wiring substrate 120 is omitted, a wiring structure including other electronic components, other wiring substrates and the connection members may be mounted on the upper surface of the upper wiring substrate 120. In this case, the component-embedded substrate 100 includes other upper wiring substrates 120, the intermediate wiring substrate 130 and the connection members 140 and 150 on the upper surface of the upper wiring substrate 120, and has an electronic component encapsulated by the encapsulating resin between the two upper wiring substrates 120, for example. Also, the component-embedded substrate 100 may be implemented by mounting an electronic component on the lower surface pad 115 of the lower wiring substrate 110 and forming an external connection terminal on the upper surface pad 123 of the upper wiring substrate 120.

Figure 33:
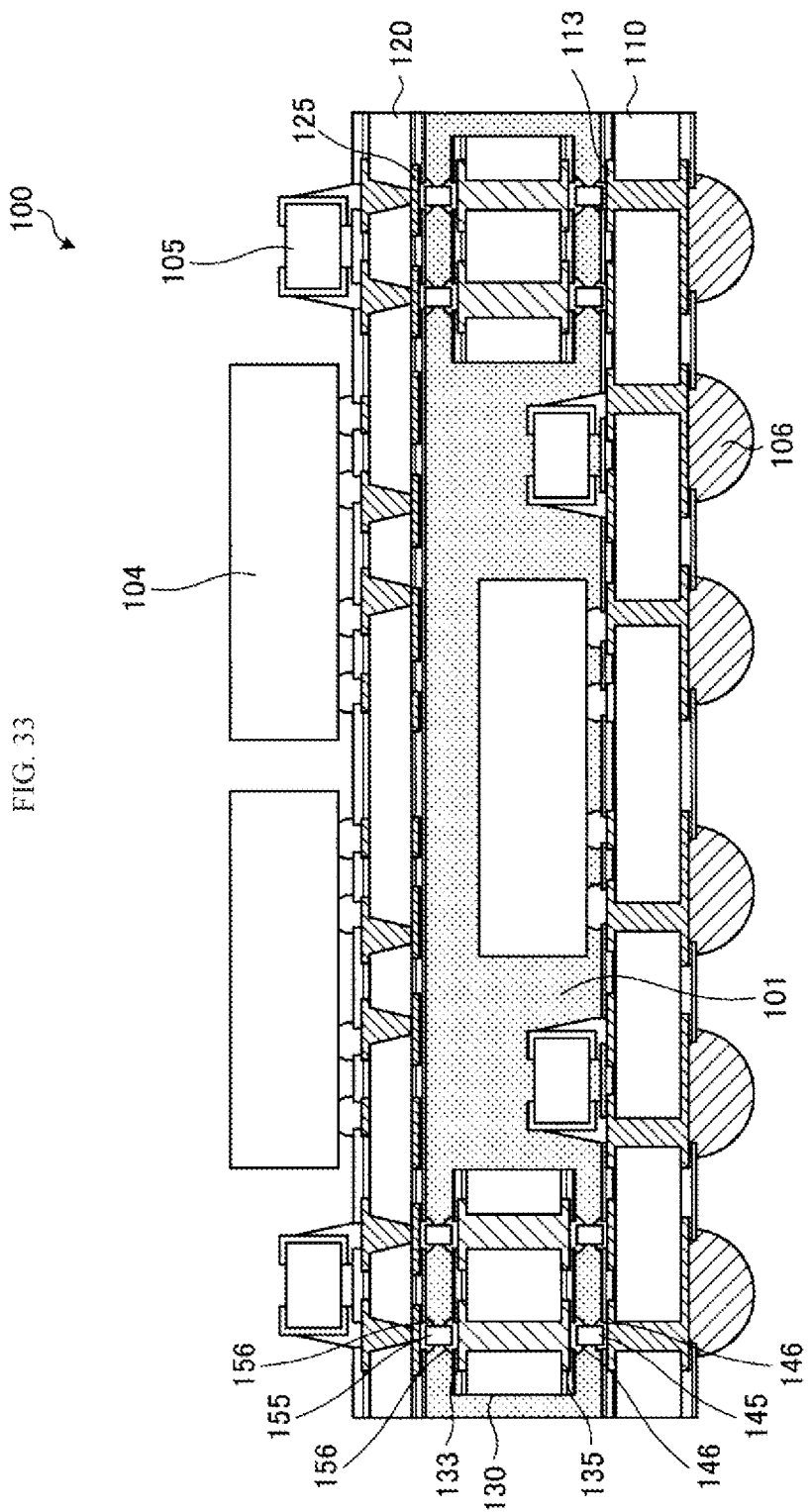
FIG. 33 depicts Modified Embodiment 4 of the component-embedded substrate.

Also, in the embodiment, each of the connection members 140 and 150 is the solder ball having a copper core, and the cores 141 and 151 are each substantially spherical. However, the connection members 140 and 150 may have any shape. Specifically, for example, as shown in FIG. 33, a cylindrical or prismatic connection member 145 may be bonded to the upper surface pad 113 of the lower wiring substrate 110 and the lower surface pad 135 of the intermediate wiring substrate 130 by a solder 146. Also, a cylindrical or prismatic connection member 155 may be bonded to the upper surface pad 133 of the intermediate wiring substrate 130 and the lower surface pad 125 of the upper wiring substrate 120 by a solder 156. The connection member 145 is made to have a cylindrical or prismatic shape, so that the upper and lower end faces of the connection member 145 are bonded to the upper surface pad 113 and the lower surface pad 135, bonding areas are increased to improve the reliability and an interval between the substrates can be easily secured. The connection member 155 is made to have a cylindrical or prismatic shape, so that the upper and lower end faces of the connection member 155 are bonded to the upper surface pad 133 and the lower surface pad 125, bonding areas are increased to improve the reliability and an interval between the substrates can be easily secured. FIG. 33 depicts Modified Embodiment 4 of the component-embedded substrate 100.

Figure 34:
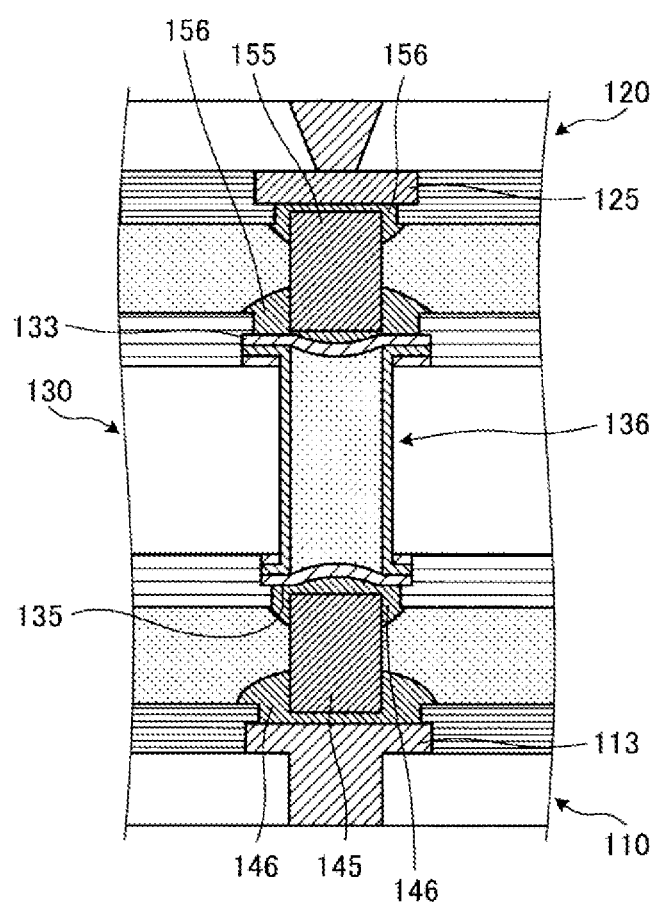
FIG. 34 is an enlarged sectional view of connection parts of a lower wiring substrate, an upper wiring substrate and an intermediate wiring substrate shown in FIG. 33.

Here, connection parts of the lower wiring substrate 110, the upper wiring substrate 120 and the intermediate wiring substrate 130 shown in FIG. 33 are further described with reference to FIG. 34. FIG. 34 is an enlarged sectional view of connection parts of the lower wiring substrate 110, the upper wiring substrate 120 and the intermediate wiring substrate 130 shown in FIG. 33. The substrate 131 of the intermediate wiring substrate 130 is formed with the through-hole wiring 136 penetrating the substrate 131, and the upper surface pad 133 and the lower surface pad 135 are connected to each other by the through-hole wiring 136. The concave portions are formed in positions of the upper surface pad 133 and the lower surface pad 135 corresponding to the through-hole wiring 136. That is, the upper surface pad 133 to which the connection member 155 is bonded and the lower surface pad 135 to which the connection member 145 is bonded are each formed with the concave portions. Since a portion of the solder 156 that is used for bonding of the connection member 155 is accommodated in the concave portion of the upper surface pad 133, it is possible to accurately perform positional alignment of the connection member 155 with respect to the intermediate wiring substrate 130. Also, since a portion of the solder 146 that is used for bonding of the connection member 145 is accommodated in the concave portion of the lower surface pad 135, it is possible to accurately perform positional alignment of the connection member 145 with respect to the intermediate wiring substrate 130. Also, the connection member 145 and the connection member 155 are arranged in positions overlapping each other, when seeing the intermediate wiring substrate 130 in the thickness direction (i.e., the vertical direction). Thereby, an electrical distance between the lower wiring substrate 110 and the upper wiring substrate 120 that are connected via the intermediate wiring substrate 130 is minimized, so that an impedance between the lower wiring substrate 110 and the upper wiring substrate 120 can be reduced.

Figure 35:
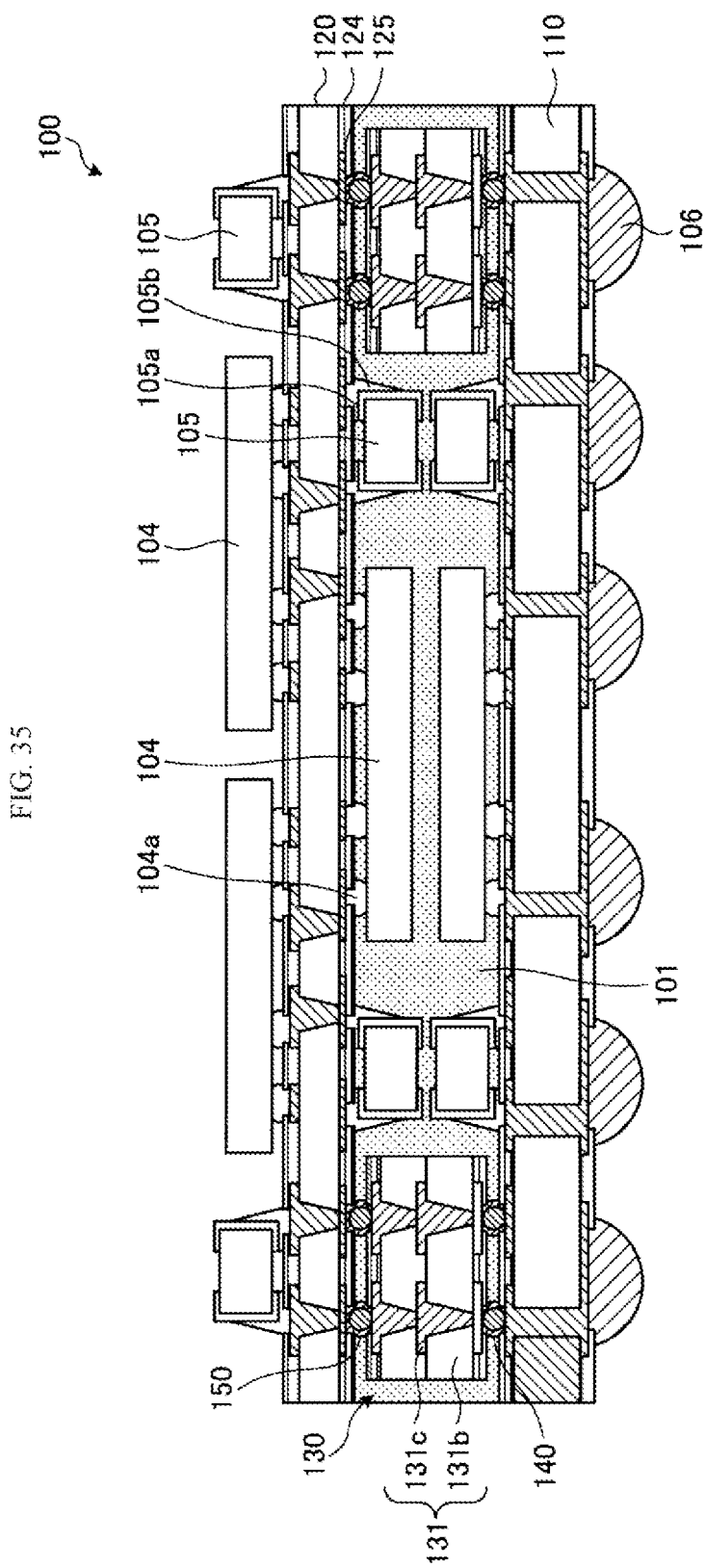
FIG. 35 depicts Modified Embodiment 5 of the component-embedded substrate.

Also, in the embodiment, the substrate 131 of the intermediate wiring substrate 130 has been described as an insulating member of a single layer. However, the substrate 131 that is a stacked substrate having a multilayered structure where an insulation layer and a wiring layer are stacked may also be used. Also, the electronic component may be mounted not only on the upper surface of the upper wiring substrate 120 but also on the lower surface of the upper wiring substrate 120. That is, for example, as shown in FIG. 35, the substrate 131 of the intermediate wiring substrate 130 may be a substrate where an insulating insulation layer 131*b* and an electroconductive wiring layer 131*c* are stacked. Thereby, since a thickness of the intermediate wiring substrate 130 increases, the interval between the lower wiring substrate 110 and the upper wiring substrate 120 is expanded, so that the IC chips 104 and the electronic components 105 can also be mounted on the lower surface of the upper wiring substrate 120. In this case, the lower surface pads 125 are exposed from the opening portions of the solder resist layer 124 for mounting of the IC chips 104 and the electronic components 105. That is, some of the lower surface pads 125 are flip chip-connected to the terminals of the IC chip 104 by the solder balls 104*a*, for example. Also, some of the lower surface pads 125 are connected to the terminals 105*a* of the electronic component 105 by the solders 105*b*. FIG. 35 depicts Modified Embodiment 5 of the component-embedded substrate 100.

Figure 36:
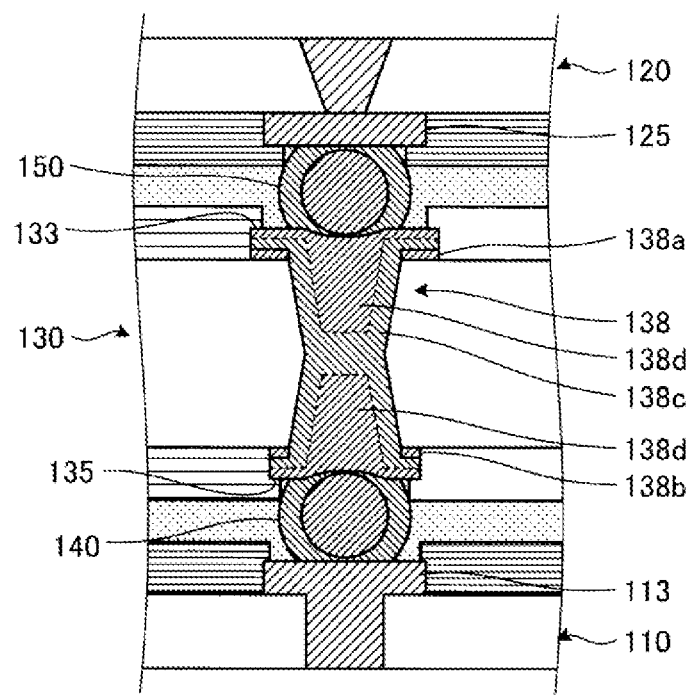
FIG. 36 illustrates connection by a via wiring.

Also, in the embodiment, the upper surface pad 133 and the lower surface pad 135 of the intermediate wiring substrate 130 are connected to each other by the through-hole wiring 136 penetrating the substrate 131 but may also be connected to each other by other through-wirings. Specifically, for example, as shown in FIG. 36, the substrate 131 of the intermediate wiring substrate 130 may be provided with a via wiring 138 penetrating the substrate 131, and the upper surface pad 133 and the lower surface pad 135 may be connected to each other by the via wiring 138. The via wiring 138 has metal layers 138*a* and 138*b* formed on both surfaces of the substrate 131, a plated layer 138*c* that covers surfaces of the metal layers 138*a* and 138*b* and the inner wall surface of the through-hole penetrating the substrate 131, and a filled plated layer 138*d* formed in the through-hole of the substrate 131. The metal layers 138*a* and 138*b* are, for example, copper metal layers. The plated layer 138*c* is formed by electroless copper plating and electrolytic copper plating, for example. The filled plated layer 138*d* is formed by filling electrolytic copper plating in the through-hole of the substrate 131. In this configuration, concave portions are each formed in positions of the upper surface pad 133 and the lower surface pad 135 corresponding to the via wiring 138. That is, the concave portions are each formed on the upper surface pad 133 to which the connection member 150 is bonded and on the lower surface pad 135 to which the connection member 140 is bonded. FIG. 36 depicts connection by the via wiring 138.

The via wiring 138 is formed integrally with the upper surface pad 133 and the lower surface pad 135 when the upper surface pad 133 and the lower surface pad 135 becoming the wiring layers of the upper surface and the lower surface of the substrate 131 are formed. In the below, a formation process of the upper surface pad 133 and the lower surface pad 135 that are formed integrally with the via wiring 138 is described with reference to FIGS. 37A to 37F. FIGS. 37A to 37F illustrate another example of the wiring layer forming process.

First, as shown in FIG. 37A, the metal layers 138*a* and 138*b* are formed on both surfaces of the substrate 131 that is an insulating plate-shaped member. The metal layers 138*a* and 138*b* are formed by depositing copper foils, for example.

As shown in FIG. 37B, a through-hole 131*d* penetrating the metal layers 138*a* and 138*b* and the substrate 131 is formed by laser processing, for example. That is, laser light is sequentially irradiated to the upper surface and the lower surface of the substrate 131, so that the through-hole 131*d* whose diameter is smallest at a central portion of the substrate 131 in the thickness direction is formed.

As shown in FIG. 37C, the plated layer 138*c* that covers the surfaces of the metal layers 138*a* and 138*b* and the inner wall surface of the through-hole 131*d* penetrating the substrate 131 is formed. That is, electroless copper plating is performed on the surfaces of the metal layers 138*a* and 138*b* and the inner wall surface of the through-hole 131*d* of the substrate 131, and electrolytic copper plating is performed using electroless copper plating as a power feeding layer. Thereby, the surfaces of the metal layers 138*a* and 138*b* and the inner wall surface of the through-hole 131*d* of the substrate 131 are covered by the electroless copper plating and electrolytic copper plating, and the smallest diameter portion of the through-hole 131*d* is blocked by the electrolytic copper plating, so that the plated layer 138*c* is formed.

As shown in FIG. 37D, the electrolytic copper plating is filled in the through-hole 131*d* of the substrate 131, so that the filled plated layer 138*d* is formed. At this time, the filled plated layer 138*d* covers an entire surface of the plated layer 138*c*. In a step where the electrolytic copper plating is filled in the through-hole 131*d* of the substrate 131 to form the filled plated layer 138*d*, concave portions 138*e* and 138*f* are each formed on upper and lower end faces of the filled plated layer 138*d*.

As shown in FIG. 37E, resist layers 139*a* and 139*b* for etching are each formed on the upper and lower end faces of the filled plated layer 138*d*. That is, the resist layers 139*a* and 139*b* each having patterns of shapes corresponding to the wiring layers of the upper surface and the lower surface of the substrate 131 are formed on the upper and lower end faces of the filled plated layer 138*d*. The resist layers 139*a* and 139*b* are formed by laminating photosensitive dry films on the surfaces of the filled plated layer 138*d* and patterning the dry films by a photolithography method, for example.

Then, as shown in FIG. 37F, the filled plated layer 138*d*, the plated layer 138*c* and the metal layers 138*a* and 138*b* are etched using the resist layers 139*a* and 139*b* as a mask. That is, the filled plated layer 138*d*, the plated layer 138*c* and the metal layers 138*a* and 138*b* of parts except the resist layers 139*a* and 139*b* are removed by etching, so that the wiring layers of the upper surface and the lower surface of the substrate 131 and the via wiring 138 are formed. The wiring layer of the upper surface of the substrate 131 includes the upper surface pad 133, and the wiring layer of the lower surface of the substrate 131 includes the lower surface pad 135. The upper surface pad 133 and the lower surface pad 135 are connected to each other by the via wiring 138. Here, concave portions corresponding to the concave portions 138*e* and 138*f* on the upper and lower end faces of the filled plated layer 138*d* remain on the upper surface pad 133 and the lower surface pad 135. That is, the concave portions 133*b* and 135*b* are each formed on the upper surface pad 133 to which the connection member 150 will be bonded in a later process and on the lower surface pad 135 to which the connection member 140 will be bonded in a later process. Then, the resist layers 139*a* and 139*b* are removed.

In this way, even when the upper surface pad 133 and the lower surface pad 135 are connected to each other by the via wiring 138 penetrating the substrate 131, the concave portions can be formed on the upper surface pad 133 and the lower surface pad 135.

Figure 38:
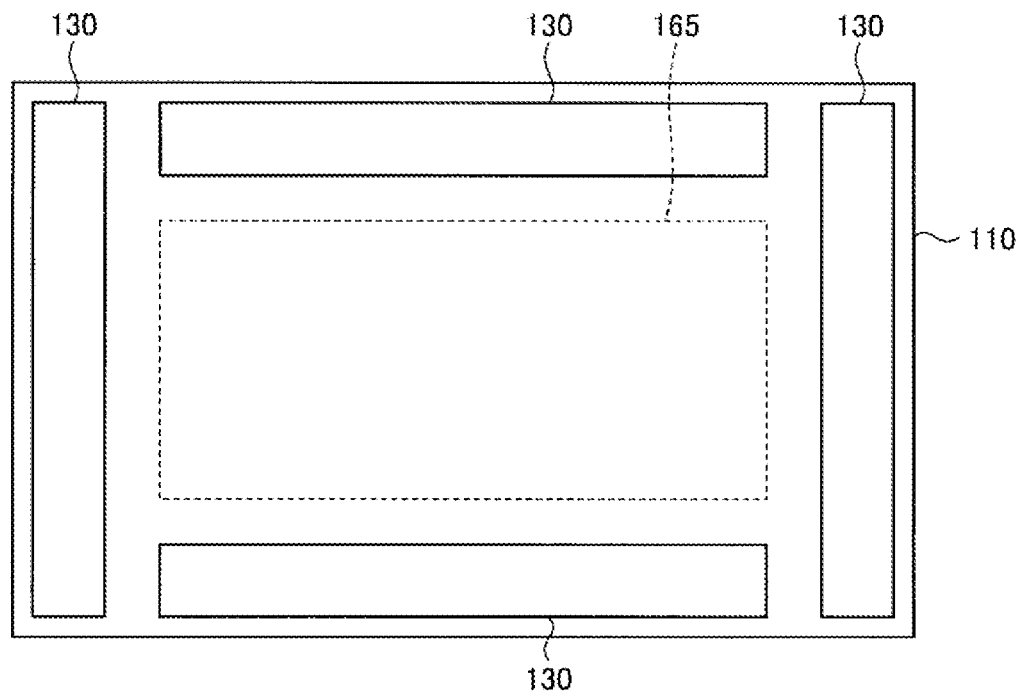
FIG. 38 depicts Modified Embodiment 1 of arrangement of the intermediate wiring substrates.
Figure 39:
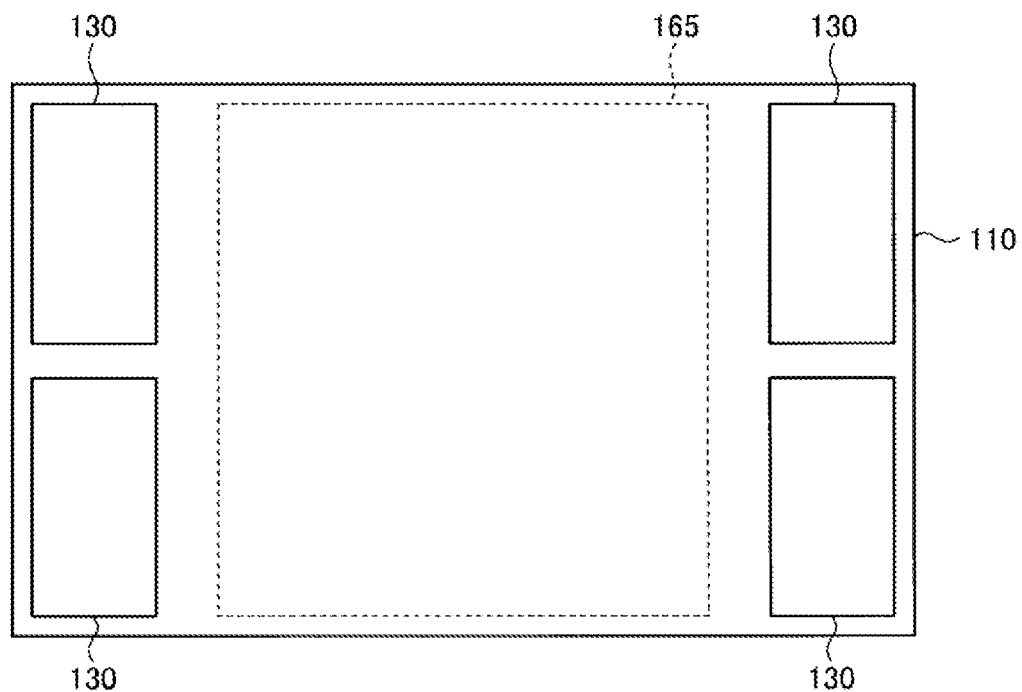
FIG. 39 depicts Modified Embodiment 2 of arrangement of the intermediate wiring substrates.

Also, in the embodiment, the two intermediate wiring substrates 130 are arranged between the lower wiring substrate 110 and the upper wiring substrate 120. However, the number and arrangement of the intermediate wiring substrates 130 are not limited thereto. That is, for example, as shown in FIG. 38, the intermediate wiring substrates 130 may also be arranged along each side of four sides of the lower wiring substrate 110 and the upper wiring substrate 120, as seen from above. Also, for example, as shown in FIG. 39, a plurality of intermediate wiring substrates 130 may be arranged along one side of the lower wiring substrate 110 and the upper wiring substrate 120, as seen from above. Also in these cases, the intermediate wiring substrates 130 are arranged in positions in which the quadrangular component mounting area 165 is sandwiched therebetween. FIG. 38 depicts Modified Embodiment 1 of arrangement of the intermediate wiring substrates 130. FIG. 39 depicts Modified Embodiment 2 of arrangement of the intermediate wiring substrates 130.

This disclosure further encompasses various exemplary embodiments, for example, described below.

[1] A manufacturing method of a component-embedded substrate comprising:

mounting an electronic component on a first wiring substrate;

arranging an intermediate wiring substrate around the electronic component on the first wiring substrate, and bonding the first wiring substrate and the intermediate wiring substrate by a first connection member;

arranging a second wiring substrate above the electronic component and the intermediate wiring substrate, and bonding the intermediate wiring substrate and the second wiring substrate by a second connection member; and covering the electronic component and the intermediate wiring substrate by filling an encapsulating resin between the first wiring substrate and the second wiring substrate, wherein the covering process comprises covering entirely side surfaces of the intermediate wiring substrate by the encapsulating resin

What is claimed is:

1. A component-embedded substrate comprising:
 a first wiring substrate;
 an electronic component provided on the first wiring substrate;
 an intermediate wiring substrate provided around the electronic component on the first wiring substrate and connected to the first wiring substrate via a first connection member;
 a second wiring substrate provided above the first wiring substrate, the electronic component and the intermediate wiring substrate, and connected to the intermediate wiring substrate via a second connection member; and an encapsulating resin filled between the first wiring substrate and the second wiring substrate and covering the electronic component and the intermediate wiring substrate,
wherein
the intermediate wiring substrate comprises:
a second substrate;
a second pad formed on a lower surface of the second substrate and connecting the first connection member;
a third pad formed on an upper surface of the second substrate and connecting the second connection member;
a through-wiring penetrating the second substrate and connecting to the second pad and the third pad, and
all side surfaces of the second substrate of the intermediate wiring substrate are entirely covered by the encapsulating resin.

2. The component-embedded substrate according to claim 1, wherein the first wiring substrate comprises:
a first substrate,
a first pad formed on an upper surface of the first substrate and connecting the first connection member, and
a first insulation layer covering the upper surface of the first substrate and having an opening portion for exposing the first pad,
wherein the intermediate wiring substrate further comprises:
a second insulation layer covering the lower surface of the second substrate and having an opening portion for exposing the second pad, and
wherein a diameter of the opening portion of the second insulation layer is smaller than a diameter of the opening portion of the first insulation layer.

3. The component-embedded substrate according to claim 1, wherein the intermediate wiring substrate further comprises:
a third insulation layer covering the upper surface of the second substrate and having an opening portion for exposing the third pad,
wherein the second wiring substrate comprises:
a third substrate,
a fourth pad formed on a lower surface of the third substrate and connecting the second connection member, and
a fourth insulation layer covering the lower surface of the third substrate and having an opening portion for exposing the fourth pad, and
wherein a diameter of the opening portion of the fourth insulation layer is smaller than a diameter of the opening portion of the third insulation layer.

4. The component-embedded substrate according to claim 1, wherein the second pad and the third pad each have concave portions formed in positions corresponding to the through-wiring.

5. The component-embedded substrate according to claim 1, wherein the intermediate wiring substrate comprises:
a second insulation layer covering the lower surface of the second substrate and having an opening portion for exposing the second pad, and
a third insulation layer covering the upper surface of the second substrate and having an opening portion for exposing the third pad,
wherein a diameter of the opening portion of the second insulation layer is smaller than a diameter of the opening portion of the third insulation layer.

6. The component-embedded substrate according to claim 1, wherein the first connection member and the second connection member are arranged in positions overlapping each other, when seeing the intermediate wiring substrate in a thickness direction.

7. The component-embedded substrate according to claim 1, wherein the intermediate wiring substrate is arranged between the electronic component and outer peripheral edges of the first wiring substrate and the second wiring substrate.

8. The component-embedded substrate according to claim 1, wherein
the first connection member comprises a spherical first core and a first solder covering the first core, and the first wiring substrate and the intermediate wiring substrate are connected by the first solder, and
the second connection member comprises a spherical second core and a second solder covering the second core, and the second wiring substrate and the intermediate wiring substrate are connected by the second solder.

9. The component-embedded substrate according to claim 1, wherein
the first connection member is cylindrical or prismatic and the first wiring substrate and the intermediate wiring substrate are connected through the first connection member by a first solder, and
the second connection member is cylindrical or prismatic and the second wiring substrate and the intermediate wiring substrate are connected through the second connection member by a second solder.

10. The component-embedded substrate according to claim 1, wherein the intermediate wiring substrate includes a plurality insulation layers and a plurality of wiring layers, the plurality insulation layers and the plurality of wiring layers being stacked.

11. The component-embedded substrate according to claim 1, wherein
the first wiring substrate and the second wiring substrate have quadrangular shapes with four sides when viewed from above,
a plurality of the intermediate wiring substrate is provided between the first wiring substrate and the second wiring substrate, and
the plurality of the intermediate wiring substrate being respectively arranged along two facing sides of the four sides of the first wiring substrate and the second wiring substrate.

12. The component-embedded substrate according to claim 1, wherein
the first wiring substrate and the second wiring substrate have quadrangular shapes with four sides when viewed from above,
a plurality of the intermediate wiring substrate is provided between the first wiring substrate and the second wiring substrate, and
the plurality of the intermediate wiring substrate being respectively arranged along each of the four sides of the first wiring substrate and the second wiring substrate.

13. The component-embedded substrate according to claim 1, wherein the encapsulating resin is filled between an upper surface of the first wiring substrate and a lower surface of the intermediate wiring substrate, and the encapsulating resin is filled between an upper surface of the intermediate wiring substrate and a lower surface of the second wiring substrate.

14. The component-embedded substrate according to claim 1, wherein side surfaces of first wiring substrate, the encapsulating resin, and the second wiring substrate are planar.

15. The component-embedded substrate according to claim 1, wherein the through wiring includes a through-hole penetrating the second substrate, a plated layer covering an inner wall of the through-hole, and a filled resin filled in the through-hole.

16. The component-embedded substrate according to claim 1, wherein the through wiring includes a through-hole penetrating the second substrate and a filled plated layer formed in the through-hole.

* * * * *